(12) United States Patent
Chang et al.

(10) Patent No.: US 12,167,611 B2
(45) Date of Patent: Dec. 10, 2024

(54) FeRAM MFM STRUCTURE WITH SELECTIVE ELECTRODE ETCH

(71) Applicant: Taiwan Semiconductor Manufacturing Company, Ltd., Hsin-Chu (TW)

(72) Inventors: Chih-Hsiang Chang, Taichung (TW); Kuo-Chi Tu, Hsin-Chu (TW); Sheng-Hung Shih, Hsinchu (TW); Wen-Ting Chu, Kaohsiung (TW); Tzu-Yu Chen, Kaohsiung (TW); Fu-Chen Chang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/357,240

(22) Filed: Jul. 24, 2023

(65) Prior Publication Data

US 2023/0371263 A1 Nov. 16, 2023

Related U.S. Application Data

(60) Continuation of application No. 17/574,010, filed on Jan. 12, 2022, now Pat. No. 11,785,777, which is a
(Continued)

(51) Int. Cl.
*H10B 51/00* (2023.01)
*G11C 11/22* (2006.01)
(Continued)

(52) U.S. Cl.
CPC ............ *H10B 53/30* (2023.02); *G11C 11/223* (2013.01); *H01L 29/40111* (2019.08);
(Continued)

(58) Field of Classification Search
CPC ............................ H01L 27/108–10897; H01L 27/11502–11514; H01L 28/00–92;
(Continued)

(56) References Cited

U.S. PATENT DOCUMENTS 5,099,305 A * 3/1992 Takenaka ............... H10B 53/00
257/295
5,561,307 A * 10/1996 Mihara .................. H10B 12/31
204/192.15
(Continued)

OTHER PUBLICATIONS

Meena, Jagan. "Overview of Emerging Non-volatile Memory Technologies." Nanoscale Research Letters 9(526):1-33 • Sep. 2014.
(Continued)

*Primary Examiner* — Eric A. Ward
(74) *Attorney, Agent, or Firm* — Eschweiler & Potashnik, LLC

(57) ABSTRACT

In some embodiments, the present disclosure relates to a method of forming an integrated chip including forming a ferroelectric layer over a bottom electrode layer, forming a top electrode layer over the ferroelectric layer, performing a first removal process to remove peripheral portions of the bottom electrode layer, the ferroelectric layer, and the top electrode layer, and performing a second removal process using a second etch that is selective to the bottom electrode layer and the top electrode layer to remove portions of the bottom electrode layer and the top electrode layer, so that after the second removal process the ferroelectric layer has a surface that protrudes past a surface of the bottom electrode layer and the top electrode layer.

20 Claims, 16 Drawing Sheets

Related U.S. Application Data division of application No. 16/394,207, filed on Apr. 25, 2019, now Pat. No. 11,227,872.

(51) Int. Cl.
  *H01L 21/28* (2006.01)
  *H01L 29/51* (2006.01)
  *H01L 29/66* (2006.01)
  *H01L 29/78* (2006.01)
  *H10B 53/30* (2023.01)

(52) U.S. Cl.
  CPC ........ *H01L 29/516* (2013.01); *H01L 29/6684* (2013.01); *H01L 29/78391* (2014.09)

(58) Field of Classification Search
  CPC ......... H01L 28/40–92; H01L 28/55–57; H01L 45/00–1691; H10B 53/00–50
  See application file for complete search history.

(56) References Cited

U.S. PATENT DOCUMENTS

| | | | |
|---|---|---|---|
| 6,051,858 A | 4/2000 | Uchida et al. | |
| 6,346,741 B1 | 2/2002 | Van Buskirk et al. | |
| 6,773,929 B2 | 8/2004 | Oh et al. | |
| 10,672,982 B1 | 6/2020 | He et al. | |
| 2002/0053739 A1* | 5/2002 | Honma | H01L 23/642 |
| | | | 257/E21.59 |
| 2003/0040161 A1 | 2/2003 | Schrenk et al. | |
| 2004/0180508 A1 | 9/2004 | Park | |
| 2005/0272171 A1 | 12/2005 | Nakayama et al. | |
| 2006/0057744 A1 | 3/2006 | Kobayashi | |
| 2007/0158698 A1 | 7/2007 | Dennison et al. | |
| 2007/0252185 A1* | 11/2007 | Kang | H01L 27/105 |
| | | | 257/295 |
| 2007/0281422 A1 | 12/2007 | Udayakumar et al. | |
| 2012/0161280 A1 | 6/2012 | Lindert | |
| 2013/0307118 A1 | 11/2013 | Tu | |
| 2015/0311435 A1 | 10/2015 | Liu et al. | |
| 2015/0318340 A1 | 11/2015 | Dirnecker | |
| 2016/0056107 A1 | 2/2016 | Kuwajima | |
| 2020/0286685 A1* | 9/2020 | Lin | H01L 28/60 |

OTHER PUBLICATIONS

Kozodaev et al. "Ferroelectric Properties of Lightly Doped La:HfO2 Thin Films Grown by Plasma-Assisted Atomic Layer Deposition." Appl. Phys. Lett. 111, 132903 (2017), published on Sep. 26, 2017.

Wikipedia.org. "Ferroelectric RAM." Published on Feb. 18, 2019. Retrieved online on Mar. 5, 2019 from https://en.wikipedia.org/wiki/Ferroelectric_RAM.

Eshraghian, Kamran. "Evolution of Nonvolatile Resistive Switching Memory Technologies: The Related Influence on Hetrogeneous Nanoarchitectures." Transactions on Electrical and Electronic Materials 11(6) • Dec. 2010.

Cypress. "F-RAM (Nonvolatile Ferroelectric RAM)." The date of publication is unknown. Retrieved online on Mar. 5, 2019 from https://www.cypress.com/products/f-ram-nonvolatile-ferroelectric-ram.

Wikipedia.org "Plasma etching." Published on Mar. 10, 2019. Retrieved online on Mar. 15, 2019 from https://en.wikipedia.org/wiki/Plasma_etching.

Non-Final Office Action dated Sep. 25, 2020 for U.S. Appl. No. 16/394,207.

Ex-Parte Quayle Office Action dated Jun. 30, 2021 for U.S. Appl. No. 16/394,207.

Notice of Allowance dated Sep. 1, 2021 for U.S. Appl. No. 16/394,207.

Non-Final Office Action dated Oct. 6, 2022 for U.S. Appl. No. 17/574,010.

Notice of Allowance dated Jun. 13, 2023 for U.S. Appl. No. 17/574,010.

* cited by examiner

FeRAM MFM STRUCTURE WITH SELECTIVE ELECTRODE ETCH

REFERENCE TO RELATED APPLICATIONS

This Application is a Continuation of U.S. application Ser. No. 17/574,010, filed on Jan. 12, 2022, which is a Divisional of U.S. application Ser. No. 16/394,207, filed on Apr. 25, 2019 (now U.S. Pat. No. 11,227,872, issued on Jan. 18, 2022). The contents of the above-referenced patent applications are hereby incorporated by reference in their entirety.

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
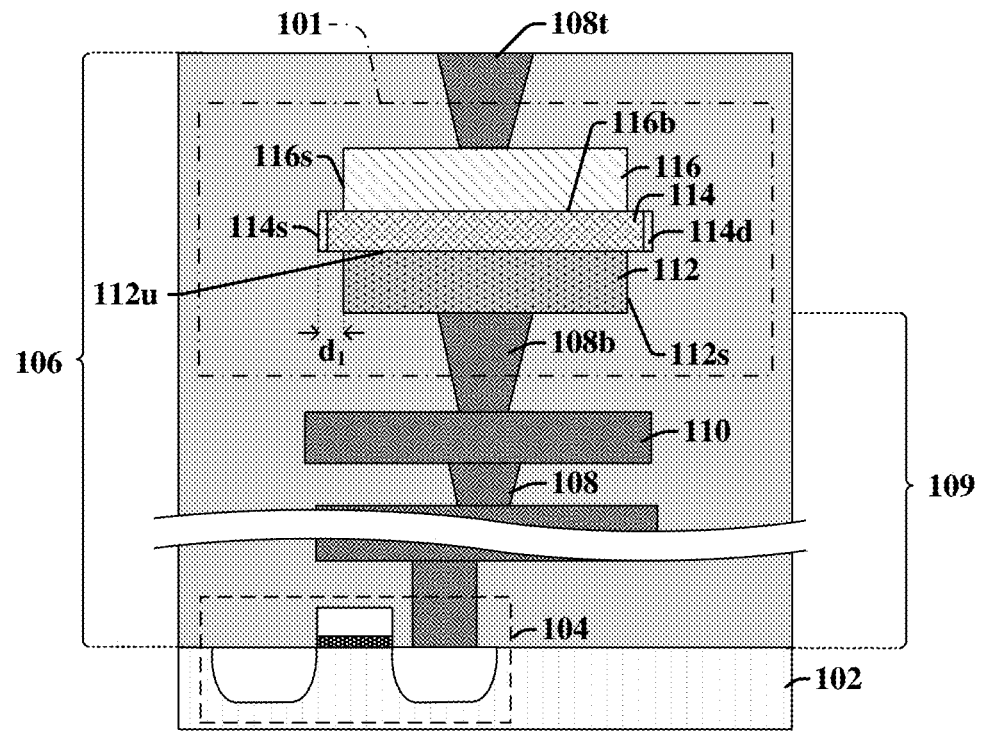
FIGS. 1A-1B illustrate cross-sectional views of some embodiments of an integrated chip having a ferroelectric random-access memory (FeRAM) cell comprising a ferroelectric layer between top and bottom electrodes, wherein the ferroelectric layer extends past outermost sidewalls of the top and bottom electrodes.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric random-access memory (FeRAM) device that has a metal/ferroelectric layer/metal (MFM) structure includes a ferroelectric layer arranged between top and bottom electrodes. FeRAM devices are configured to store data values based on a process of reversible switching between polarization states because the ferroelectric layer's crystal structure is capable of changing when an electric field is present. For example, in a FeRAM cell, a negative voltage bias applied to a ferroelectric layer may induce atoms to shift into a first crystal structure orientation, which has a first resistance indicating a first data value (e.g., a logical '1'), whereas a positive voltage bias applied to the ferroelectric layer may induce atoms to shift into a second crystal structure orientation, which has a second resistance indicating a second data value (e.g., a logical '0').

A method for forming a FeRAM cell may, for example, comprise depositing a bottom electrode over one or more interconnect layers coupled to an access transistor. A first mask may be used to pattern the bottom electrode. A ferroelectric layer may be deposited over and extend past the patterned bottom electrode, and a top electrode may be deposited over the ferroelectric layer. A second mask may be used to pattern the top electrode. The top electrode may be patterned using a plasma etch.

Another method for forming a FeRAM cell, may, for example, comprise depositing a bottom electrode over one or more interconnect layers coupled to an access transistor. Then, a top electrode over a ferroelectric layer may be deposited over the bottom electrode. A first mask and a plasma etch may be used to pattern the bottom electrode, ferroelectric layer, and the top electrode.

However, in both methods, the plasma etch may damage the crystal structure of the ferroelectric layer that is between the top and bottom electrodes. Examples of damages to the crystal structure due to the plasma etch may include a crystal structure that favors one of the crystal structure orientations, a crystal structure that no longer exhibits ferroelectric characteristics, and crystal structure defects (e.g., dislocations, vacancies, dangling bonds) that cause a device to breakdown and/or have a shorter life-time. Thus, damage to the crystal structure of the ferroelectric layer negatively effects the reversible switching between polarization states of a FeRAM device, reducing device reliability.

To prevent a FeRAM device from having a damaged ferroelectric layer, undamaged portions of the ferroelectric layer may be arranged between the top electrode and the bottom electrode, whereas the damaged portions of the ferroelectric layer are confined to positions outside of the top electrode and the bottom electrode. Thus, electric fields used to change a crystalline state of the ferroelectric layer are applied to the undamaged portions of the ferroelectric layer, such that the damaged portions of the ferroelectric layer do not affect FeRAM device reliability.

Various embodiments of the present disclosure provide a method of manufacturing a FeRAM cell having a top electrode over a bottom electrode, separated by an undamaged ferroelectric layer to produce reliable FeRAM devices. In some embodiments, the method includes depositing ferroelectric layer over a bottom electrode layer, and depositing a top electrode layer over the ferroelectric layer. A first removal step is performed to remove peripheral portions of the bottom electrode layer, the ferroelectric layer, and the top electrode layer. The first removal step may use a first mask. A second removal step is then performed using a second etch that is selective to the bottom electrode layer and the top electrode layer, and does not utilize a mask. The second etch causes the ferroelectric layer to protrude outward from between the bottom and top electrode layers, thereby relating parts of the ferroelectric layer that may have been subjected to plasma damage to outside of the bottom and top electrode layers.

Therefore, the present disclosure presents a method of manufacturing that prevents damaged portions of the ferroelectric layer from being used to operate the FeRAM device, thereby producing reliable FeRAM devices.

FIG. 1A illustrates a cross-sectional view 100A of some embodiments of an integrated chip comprising a FeRAM cell.

The integrated chip in the cross-sectional view 100A includes a FeRAM cell 101 arranged over a substrate 102. In some embodiments, the FeRAM cell 101 comprises a ferroelectric layer 114 between a bottom electrode 112 and a top electrode 116. The ferroelectric layer 114, the bottom electrode 112, and the top electrode 116 are vertically stacked layers that laterally extend. In some embodiments, the ferroelectric layer 114 directly contacts a first surface 112u of the bottom electrode 112 and a second surface 116b of the top electrode 116. The bottom electrode 112 is separated from the substrate 102 by one or more lower interconnect layers 109 embedded within a dielectric structure 106. The dielectric structure 106 may comprise one or more stacked inter-layer dielectric (ILD) layers. The one or more lower interconnect layers 109 comprise, in some embodiments, interconnect vias 108 and interconnect wires 110. A bottom electrode via 108b couples the bottom electrode 112 to an access transistor 104 disposed in the substrate 102, and the top electrode 116 is coupled to a top electrode via 108t.

In some embodiments, the ferroelectric layer 114 laterally extends past the bottom electrode 112 and the top electrode 116, so that the ferroelectric layer 114 has outermost sidewalls 114s that are laterally separated from outermost sidewalls 112s of the bottom electrode 112 and that are laterally separated from outermost sidewalls 116s of the top electrode 116. In other words, a vertically extending axis along the outermost sidewalls 114s of the ferroelectric layer 114 would not intersect with the bottom electrode 112 or the top electrode 116, wherein the vertically extending axis is substantially normal to a top surface of the ferroelectric layer 114. The outermost sidewalls 114s of the ferroelectric layer 114 are laterally separated from the outermost sidewalls 112s of the bottom electrode and the outermost sidewalls 116s of the top electrode 116 by a first distance $d_1$. In some embodiments, the first distance $d_1$ is in a range of between approximately 5 nanometers and approximately 10 nanometers.

In some embodiments, the outermost sidewalls 114s of the ferroelectric layer 114 may be damaged due to plasma etching effects during the forming the FeRAM cell 101. The plasma damage causes the ferroelectric layer 114 to have a damaged region 114d along the outermost sidewalls 114s. Thus, the first distance $d_1$ may be greater than or equal to a depth of the damaged region 114d of the ferroelectric layer 114 at its outermost sidewalls 114s to prevent the damaged region 114d of the ferroelectric layer 114 from being used to store data in the FeRAM cell 101. Instead, undamaged portions of the ferroelectric layer 114 are arranged between the top electrode 116 and the bottom electrode 112 for reliable data storage in the FeRAM cell 101.

Figure 1B:
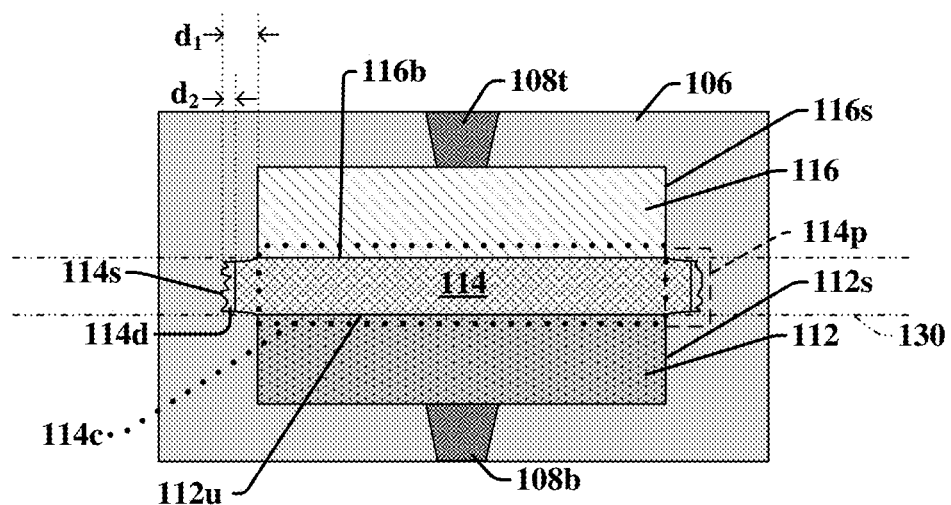

FIG. 1B illustrates a cross-sectional view 100B of some embodiments of a FeRAM cell having a ferroelectric layer with damaged outer sidewalls.

The cross-sectional view 100B represents the FeRAM cell 101 of FIG. 1A with some additional features. The ferroelectric layer 114 has protruded portions 114p surrounding a center portion 114c. In some embodiments, the protruded portions 114p are confined between lines 130 that extend along the first surface 112u of the bottom electrode 112 and the second surface 116b of the top electrode 116. In some embodiments, the center portion 114c is also confined between lines 130. The center portion 114c is in direct contact with the bottom electrode 112 and the top electrode 116, such that FeRAM cell operates by using the center portion 114c of the ferroelectric layer 114, not the protruded portions 114p of the ferroelectric layer 114. The protruded portions 114p of the ferroelectric layer 114 laterally extend past the outermost sidewalls 112s of the bottom electrode 112 and the outermost sidewalls 116s of the top electrode 116 in a first direction. In some embodiments, the first direction is perpendicular to a second direction that is normal to the first surface 112u of the bottom electrode 112. The protruded portions 114p comprise the outermost sidewalls 114s of the ferroelectric layer 114.

In some embodiments, the outermost sidewalls 114s of the ferroelectric layer 114 are damaged due to plasma etching effects during the forming of the FeRAM cell 101. In some embodiments, the plasma damage causes the ferroelectric layer 114 to have a damaged region 114d along the outermost sidewalls 114s. The damaged region 114d may have, at the outermost sidewalls 114s, a greater surface roughness than top or bottom surfaces of the ferroelectric layer 114, indicating etching damage on the outermost sidewalls 114s of the ferroelectric layer 114. In other embodiments, the surface roughness of the outermost sidewalls 114s and the surface roughness of the top or bottom surfaces of the ferroelectric layer 114 may be comparable, and thus, damage to the ferroelectric layer 114, although present, may not be indicated via surface roughness measurements. Damage to the ferroelectric layer 114 in the damaged region 114d may include, for example, dislocations, dangling bonds, and/or vacancies, thereby disturbing the crystal structure and thus, the ferroelectric properties of the ferroelectric layer 114. Nevertheless, in the cross-sectional view 100B of FIG. 1B, the damage to the outermost sidewalls 114s of the ferroelectric layer 114 is illustrated by a high surface roughness.

The damaged region 114d of the ferroelectric layer 114 may extend into the ferroelectric layer 114 from the outermost sidewalls 114s to a second distance $d_2$. In some embodiments, the second distance $d_2$ is less than the first distance $d_1$. In other embodiments, the second distance $d_2$ is substantially equal to the first distance $d_1$. Thus, in some embodiments, the protruded portions 114p of the ferroelectric layer 114 comprise the damaged region 114d of the ferroelectric layer 114, whereas the center portion 114c of the ferroelectric layer 114 comprise undamaged portions of the ferroelectric layer 114 to reliably store data.

In some embodiments, the ferroelectric layer 114 may have an upper surface laterally outside of the bottom electrode 112 and the top electrode 116 that is recessed below an upper surface of the ferroelectric layer 114 directly between the bottom electrode 112 and the top electrode 116. In such embodiments, the ferroelectric layer 114 may larger thickness below the top electrode 116 than laterally outside of the top electrode 116. In some additional embodiments, the ferroelectric layer 114 may have a lower upper surface laterally outside of the bottom electrode 112 and the top electrode 116 that is above a lower surface of the ferroelectric layer 114 directly between the bottom electrode 112 and the top electrode 116.

In some embodiments, the top electrode 116 and the bottom electrode 112 comprise a same material. In other embodiments, the top electrode 116 may comprise a different material than the bottom electrode 112. In some embodiments, the top electrode 116 and/or the bottom electrode 112 may comprise multiple layers of conductive material.

Figure 2A:
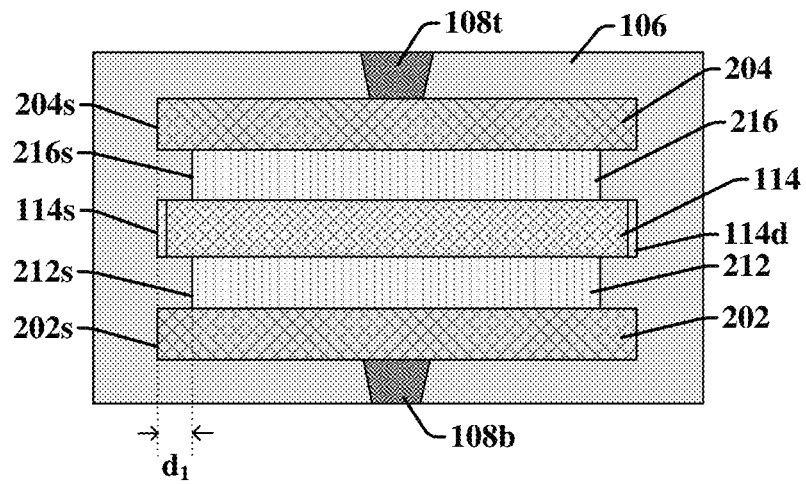
FIGS. 2A-2B illustrate cross-sectional views of some embodiments of a FeRAM cell comprising a ferroelectric layer below first and second layers of a top electrode and above first and second layers of a bottom electrodes, wherein the ferroelectric layer extends past outermost sidewalls of the first layers of the top and bottom electrodes.

FIG. 2A illustrates a cross-sectional view 200A of some embodiments of a FeRAM cell comprising top and bottom electrodes respectively comprising multiple materials.

The FeRAM cell of cross-sectional view 200A includes a bottom electrode having a second layer 212 arranged over a first layer 202. The first layer of the bottom electrode 202 is coupled to and directly contacts the bottom electrode via 108b. A ferroelectric layer 114 is above the second layer of the bottom electrode 212. In some embodiments, a top surface of the second layer of the bottom electrode 212 directly contacts a bottom surface of the ferroelectric layer 114. Above the ferroelectric layer 114 is a top electrode having a first layer 204 arranged over a second layer 216. In some embodiments, a bottom surface of the second layer of the top electrode 216 directly contacts a top surface of the ferroelectric layer 114. Between the second layer of the top electrode 216 and the top electrode via 108t is the first layer of the top electrode 204. In some embodiments, the ferroelectric layer 114 laterally extends past both the second layer of the bottom electrode 212 and the second layer of the top electrode 216 such that a damaged region 114d of the ferroelectric layer 114 is not relied on for data storage. In some embodiments, the ferroelectric layer 114 laterally extends past outermost sidewalls 216s of the second layer of the top electrode 216 and laterally extends past outermost sidewalls 212s of the second layer of the bottom electrode 212 by a first distance $d_1$.

In some embodiments, the outermost sidewalls 114s of the ferroelectric layer 114 may be substantially laterally aligned (i.e., aligned along a vertical line perpendicular to a bottom surface of the dielectric structure 106) with outermost sidewalls 204s of the second layer of the top electrode 204 and with outermost sidewalls 202s of the first layer of the bottom electrode 202. In other embodiments (not shown), the outermost sidewalls 114s of the ferroelectric layer 114 may be laterally between the outermost sidewalls 204s of the second layer of the top electrode 204 and/or the outermost sidewalls 202s of the first layer of the bottom electrode 202.

In some embodiments, the first layer of the top electrode 204 and the first layer of the bottom electrode 202 comprise a first material, whereas the second layer of the top electrode 216 and the second layer of the bottom electrode 212 comprise a second material different than the first material. In other embodiments, the first layer of the bottom electrode 202, the first layer of the top electrode 204, the second layer of the bottom electrode 212, and the second layer of the top electrode 216 may each comprise different materials from one another.

Figure 2B:
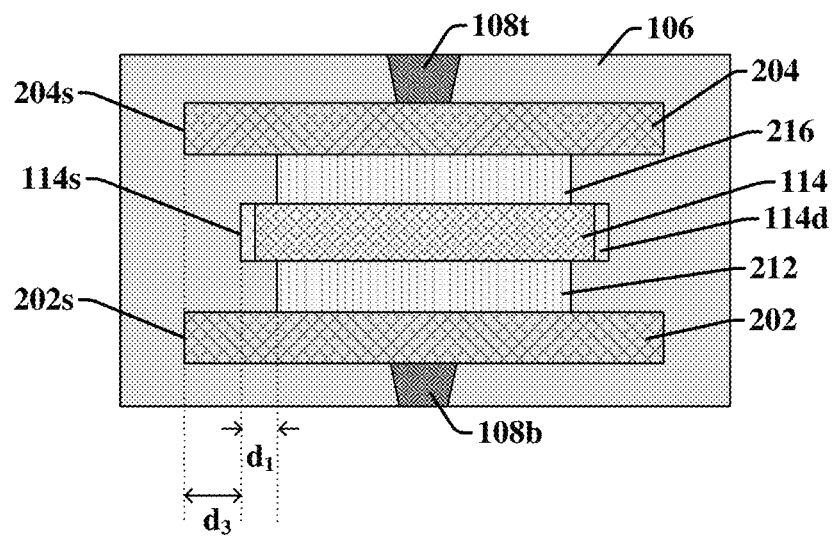

FIG. 2B illustrates a cross-sectional view 200B of an additional embodiment of a FeRAM cell comprising a multiple top and bottom electrodes.

The cross-sectional view 200B of FIG. 200B includes the features of the cross-sectional view 200A of FIG. 2A. In some embodiments, the outermost sidewalls 202s of the first layer of the bottom electrode 202 and the outermost sidewalls 204s of the first layer of the top electrode 204 may laterally extend past the outermost sidewalls 114s of the ferroelectric layer 114 by a third distance $d_3$ that is larger than the first distance $d_1$. In the cross-sectional views 200A and 200B, the outermost sidewalls 202s of the first layer of the bottom electrode 202 and the outermost sidewalls 204s of the first layer of the top electrode 204 are substantially vertically aligned. In other embodiments, due to etching effects, the outermost sidewalls 202s of the first layer of the bottom electrode 202 and the outermost sidewalls 204s of the first layer of the top electrode 204 may be slightly vertically misaligned.

Figure 3:
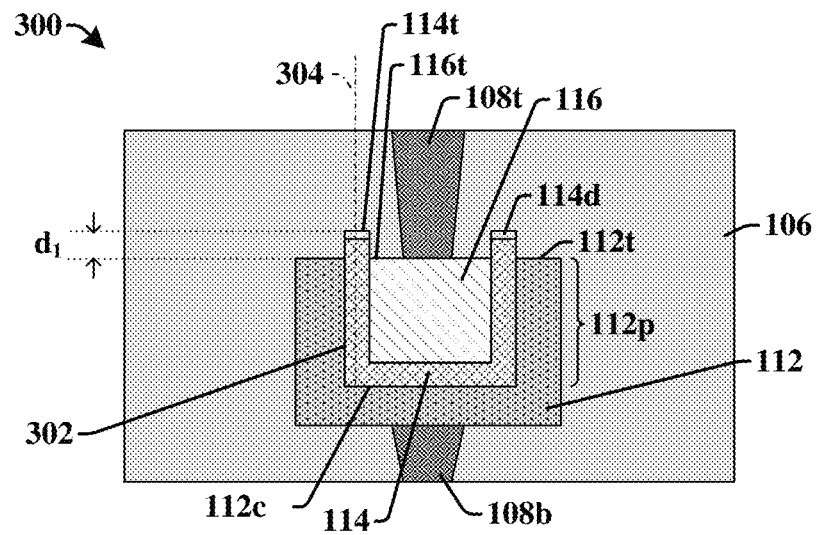
FIG. 3 illustrates a cross-sectional view of some embodiments of a FeRAM cell comprising a ferroelectric layer between a top electrode and a bottom electrode, wherein a topmost surface of the ferroelectric layer is above topmost surfaces of the top and bottom electrodes.

FIG. 3 illustrates a cross-sectional view 300 of some embodiments of a FeRAM cell comprising a ferroelectric layer having a topmost surface that is above topmost surfaces of top and bottom electrodes.

The FeRAM cell illustrated in cross-sectional view 300 includes a bottom electrode 112 that has outer protruded portions 112p. The outer protruded portions 112p extend from a central top surface 112c of the bottom electrode 112 to a topmost surface 112t of the bottom electrode 112, wherein the topmost surface 112t is above the central top surface 112c. Disposed along inner surfaces of the outer protruded portions 112p of the bottom electrode 112 and along the central top surface 112c of the bottom electrode 112 is the ferroelectric layer 114. Within inner surfaces of the ferroelectric layer 114 is a top electrode 116. In some embodiments, the ferroelectric layer 114 extends past the topmost surface 112t of the bottom electrode 112 so that a topmost surface 114t of the ferroelectric layer 114 is above the topmost surface 112t of the bottom electrode 112. In some embodiments, the top electrode 116 directly contacts the ferroelectric layer 114 and has a topmost surface 116t that is below a topmost surface 114t of the ferroelectric layer 114. In some embodiments, portions of the ferroelectric layer 114 and portions of the bottom electrode 112 meet at an interface 302. A first line 304 that is parallel to the interface 302 may be between the bottom electrode 112 and the top electrode 116 and may also extend through the topmost surface 114t of the ferroelectric layer 114. In some embodiments, the topmost surface 114t of the ferroelectric layer 114 may also be an outermost surface of the ferroelectric layer 114. In some embodiments, the topmost surface 114t of the ferroelectric layer 114 is above the topmost surface of the 116t of the top electrode 116 and/or the topmost surface 112t of the bottom electrode 112 by the distance $d_1$. In some embodiments, the distance $d_1$ is in a range of between approximately 5 nanometers and approximately 10 nanometers. In some embodiments, the topmost surface 114t of the ferroelectric layer 114 may be damaged due to etching effects during patterning thereby defining a damaged region 114d of the ferroelectric layer, and thus, the damaged region 114d is not in contact with the bottom and top electrodes 112, 116. Instead, undamaged portions of the ferroelectric layer 114 are surrounded by the bottom and top electrodes 112, 116 to reliably store data in the FeRAM cell.

Figure 4:
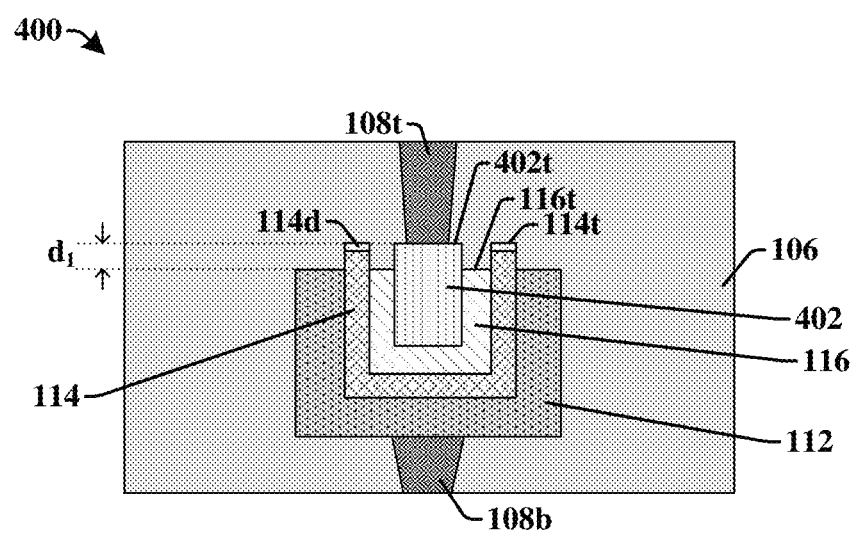
FIG. 4 illustrates a cross-sectional view of some embodiments of a FeRAM cell comprising a ferroelectric layer between a bottom electrode and a top electrode comprising an additional layer of the top electrode, wherein a topmost surface of the ferroelectric layer is above topmost surfaces of the top electrode and the bottom electrode.

FIG. 4 illustrates a cross-sectional view 400 of some embodiments of a FeRAM cell comprising a top electrode with an additional layer.

The cross-sectional view 400 of FIG. 4 includes the features of the cross-sectional view 300 of FIG. 3 with an additional layer of the top electrode 402. In some embodiments, the additional layer of the top electrode 402 is arranged over the top electrode 116, such that sidewalls and a bottom surface of the additional layer of the top electrode 402 contact the top electrode 116. In some embodiments, a topmost surface 402t of the additional layer of the top electrode 402 is substantially aligned with the topmost surface 114t of the ferroelectric layer 114. In other embodiments, the topmost surface 402t of the additional layer of the top electrode 402 may be substantially aligned with the topmost surface 116t of the top electrode 116. The additional layer of the top electrode 402 is spaced apart from the ferroelectric layer 114 by the dielectric structure 106 and the top electrode 116. In some embodiments, the additional layer of the top electrode 402 comprises a different material than the top electrode 116. In some embodiments, the additional layer of the top electrode 402 also comprises a different material than the bottom electrode 112.

Figure 5A:
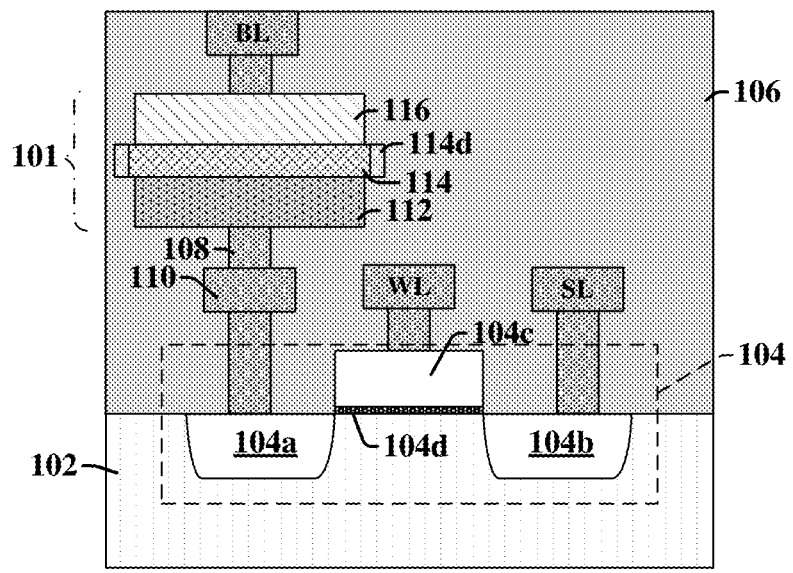
FIGS. 5A-5B illustrate cross-sectional views of some embodiments of an integrated chip having a FeRAM cell coupled to an access transistor.

FIG. 5A illustrates a cross-sectional view 500A of some embodiments of an integrated chip having a FeRAM cell.

The cross-sectional view 500A of FIG. 5A comprises a FeRAM cell 101 coupled to an access transistor 104. The access transistor 104 comprises a drain region 104a and a source region 104b within a substrate 102. Between the drain region 104a and the source region 104b and above the substrate 102, is a gate electrode 104c. A gate dielectric layer 104d separates the gate electrode 104c from the substrate 102. A dielectric structure 106 is arranged over the substrate 102 and surrounds interconnect vias 108 and interconnect wires 110. In some embodiments, the source region 104b is coupled to a source-line SL, and the gate electrode 104c is coupled to a word-line WL. A top electrode 116 of the FeRAM cell 101, in some embodiments, may be coupled to a bit-line BL, and a bottom electrode 112 of the FeRAM cell 101 may be coupled to the drain region 104a. When the FeRAM cell 101 is accessed through the bit-line BL, word-line WL, and source-line SL, a first or second data state can be written on or read from the FeRAM cell 101 through a ferroelectric layer 114. The ferroelectric layer 114 has a damaged region 114d that may have a damaged crystal structure and thus, do not contact the bottom electrode 112 or the top electrode 116 such that the FeRAM cell 101 stores data onto undamaged portions of the ferroelectric layer 114.

Figure 5B:
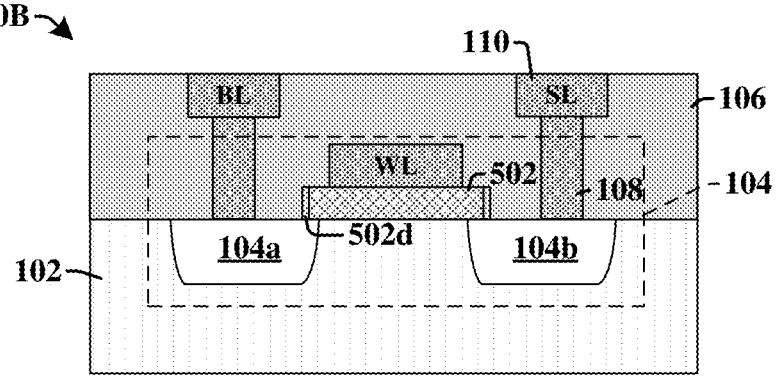

FIG. 5B illustrates a cross-sectional view 500B of another embodiment of an integrated chip having a ferroelectric gate layer.

The cross-sectional view 500B of FIG. 5B comprises another embodiments of an access transistor 104 having a ferroelectric gate layer 502 arranged above a substrate 102. The access transistor 104 also comprises a drain region 104a and a source region 104b that are arranged beside the ferroelectric gate layer 502 and within the substrate 102. A dielectric structure 106 is arranged over the substrate 102 and surrounds interconnect vias 108 and interconnect wires 110. In some embodiments, the drain region 104a is coupled to a bit-line BL and the source region 104b is coupled to a source-line SL. When the access transistor 104 is accessed through the bit-line BL, word-line WL, and source-line SL, a first or second data state can be written on or read from the ferroelectric gate layer 502. The ferroelectric gate layer 502 has outermost sidewalls that are laterally separated from outermost sidewalls of the word-line WL. The outermost sidewalls of the ferroelectric gate layer 502 may have a damaged crystal structure thereby defining a damaged gate region 502d, and thus, in some embodiments, the damaged gate region 502d of the ferroelectric gate layer 502 do not contact the word-line WL and therefore do contribute to data storage.

FIGS. 6-13 illustrate cross-sectional views 600-1300 of some embodiments of a method of forming an integrated chip having a FeRAM cell. Although FIGS. 6-13 are described in relation to a method, it will be appreciated that the structures disclosed in FIGS. 6-13 are not limited to such a method, but instead may stand alone as structures independent of the method.

Figure 6:
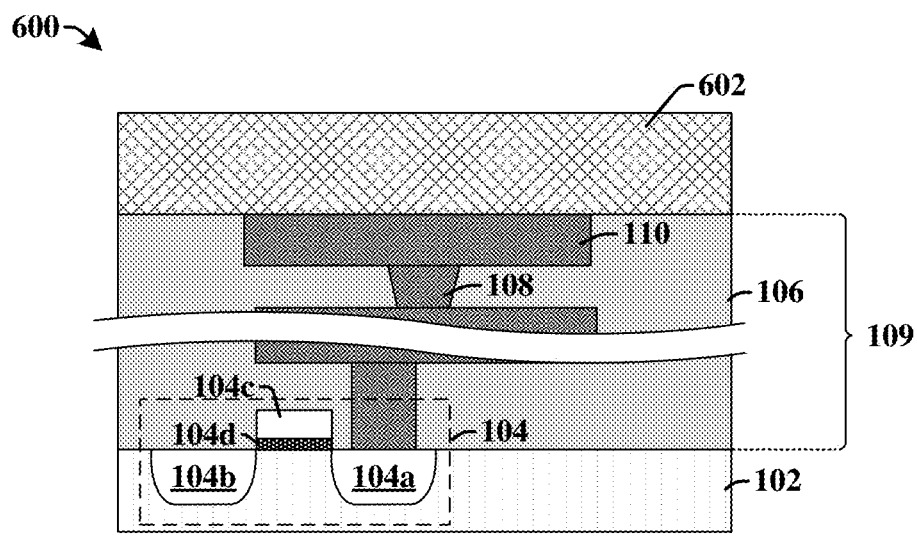
FIGS. 6-13 illustrate cross-sectional views of some embodiments of methods of patterning a ferroelectric layer between top and bottom electrodes in a FeRAM cell.

As shown in the cross-sectional view 600 of FIG. 6, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. An access transistor 104 may be formed over the substrate 102 and may comprise a drain region 104a, a source region 104b, a gate electrode 104c, and a gate dielectric layer 104d. One or more lower interconnect layers 109 are formed within a dielectric structure 106 arranged over the substrate 102 and are coupled to the access transistor 104. In some embodiments, one or more of the one or more lower interconnect layers 109 may be formed using a damascene process (e.g., a single damascene process or a dual damascene process). The one or more lower interconnect layers 109 may comprise interconnect vias 108 and interconnect wires 110. In some embodiments, the one or more lower interconnect layers 109 may comprise tungsten, copper, and/or aluminum, and/or the like.

In some embodiments, the dielectric structure 106 may comprise for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, an etch stop layer 602 is formed over the dielectric structure 106 and one of the interconnect wires 110. The etch stop layer 602, in some embodiments, may comprise a different material than the dielectric structure 106. In other embodiments, the etch stop layer 602 may comprise the same material as the dielectric structure 106. The etch stop layer 602 may, for example, comprise an oxide (e.g., silicon rich oxide), a nitride (e.g., silicon nitride, silicon oxynitride), a carbide (e.g., silicon carbide), or the like. In some embodiments, the dielectric structure 106 and the etch stop layer 602 may be deposited by a physical vapor deposition technique (e.g., PVD, CVD, PE-CVD, ALD, etc.).

Figure 7:
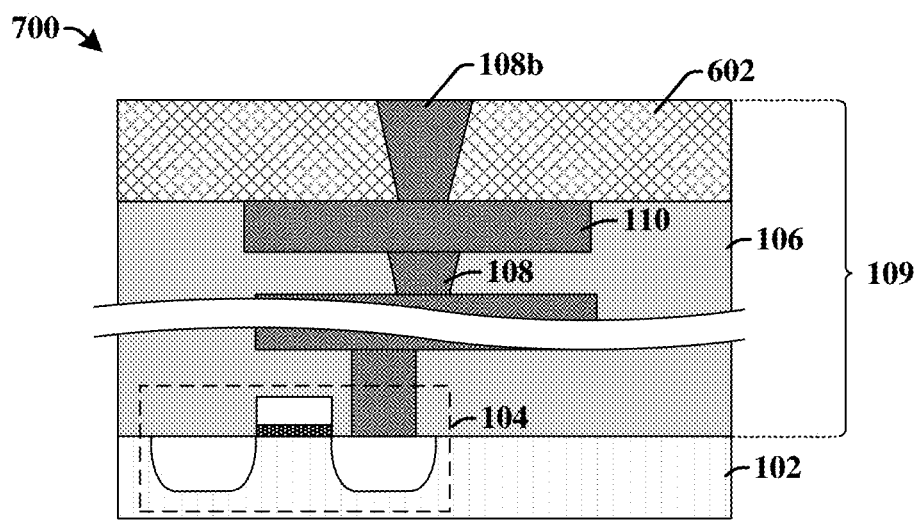

As shown in the cross-sectional view 700 of FIG. 7, the etch stop layer 602 is patterned and a bottom electrode via 108b is formed within the etch stop layer 602. In some embodiments, the bottom electrode via 108b may be formed using a damascene process (e.g., a single damascene process or a dual damascene process). The damascene process is performed by etching the etch stop layer 602 to form a via hole and/or a metal trench, and filling the via hole and/or metal trench with the bottom electrode via 108b. In some embodiments, the bottom electrode via 108b, which comprises a conductive material, may be formed using a deposition process and/or a plating process (e.g., electroplating, electro-less plating, etc.). In some embodiments, the bottom electrode via 108b is a part of the one or more lower interconnect layers 109 and thus, may comprise tungsten, copper, and/or aluminum, and/or the like.

FIGS. 8A-8D illustrate cross-sectional views 800A-800D of some embodiments of a method of forming the FeRAM cell 101 of FIGS. 1A and 1B.

Figure 8A:
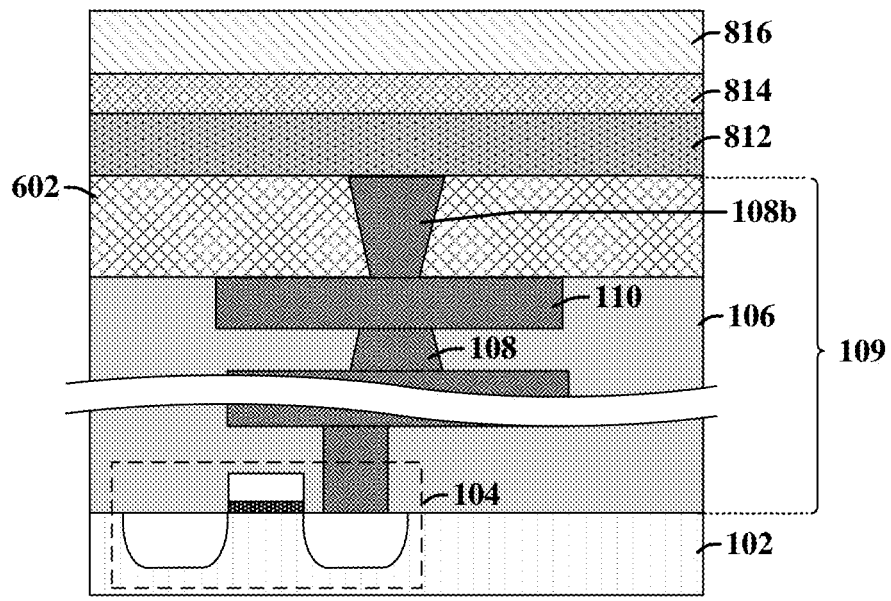

As shown in the cross-sectional view 800A of FIG. 8A, a bottom electrode layer 812 is formed over the etch stop layer 602 and the bottom electrode via 108b. In some embodiments, the bottom electrode layer 812 may be formed using a deposition process and/or a plating process (e.g., electroplating, electro-less plating, etc.). A ferroelectric material 814 is then formed over the bottom electrode layer 812. In some embodiments, the ferroelectric material 814, comprises a ferroelectric material, such as, for example, strontium bismuth tantalite, lead zirconate titanate, hafnium zirconium oxide, doped hafnium oxide, or the like. In some embodiments, the ferroelectric material 814 may have a thickness in a range of between approximately 10 angstroms and approximately 200 angstroms. In some embodiments, the ferroelectric material 814 may be formed by an atomic layer deposition process. A top electrode layer 816 is then deposited over the ferroelectric material 814. The top electrode layer 816 may be formed, in some embodiments, using a deposition process and/or a plating process (e.g., electroplating, electro-less plating, etc.). In some embodiments, the bottom electrode layer 812 and the top electrode layer 816 may each comprise, for example, titanium nitride, tantalum nitride, tungsten, ruthenium, iridium, or the like. In some embodiments, the top electrode layer 816 and the bottom electrode layer 812 may comprise the same material, whereas in other embodiments, the top electrode layer 816 and the bottom electrode layer 812 may comprise different materials. In some embodiments, the bottom electrode layer 812 and the top electrode layer 816 may each have a thickness that is in a range of between approximately 50 nanometers and approximately 300 nanometers.

Figure 8B:
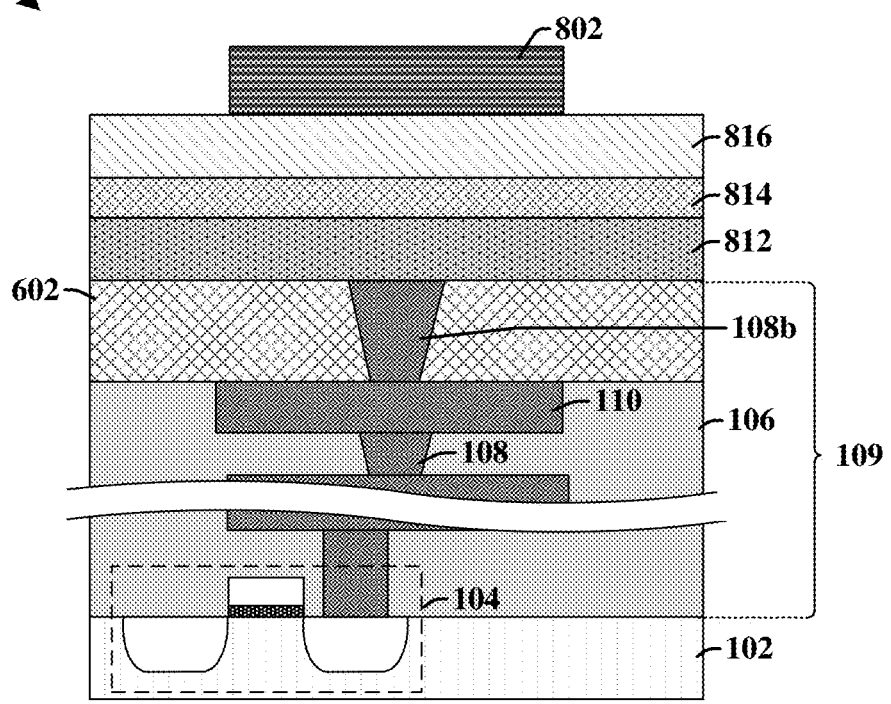

As shown in the cross-sectional view 800B of FIG. 8B, a first mask 802 is formed over the top electrode layer 816. In some embodiments, the first mask 802 is substantially centered over the bottom electrode via 108b. In some embodiments, the first mask 802 may comprise a photosensitive material (e.g., photoresist) formed by a spin coating process, and then selectively exposed to electromagnetic radiation according to a photomask. The electromagnetic radiation modifies a solubility of exposed regions within the photosensitive material to define soluble regions. The photosensitive material is subsequently developed to remove the soluble regions, thereby forming the first mask 802 in cross-sectional view 800B. In other embodiments, the first mask 802 may comprise a silicon nitride layer, a silicon carbide layer, or the like.

Figure 8C:
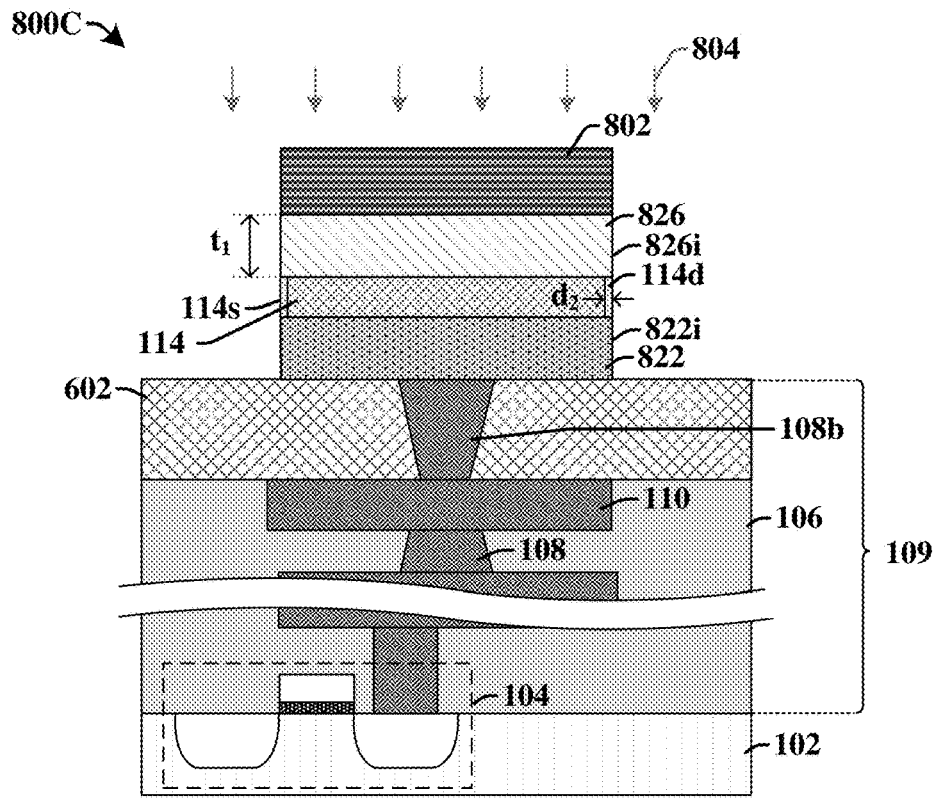

As shown in the cross-sectional view 800C of FIG. 8C, a first etch 804 is performed according to the first mask 802, thereby removing portions of the top electrode layer 816, the ferroelectric material 814, and the bottom electrode layer 812 that were uncovered by the first mask (802 in FIG. 8C) and forming a patterned bottom electrode 822, a ferroelectric layer 114, and a patterned top electrode 826. The patterned bottom electrode 822 has an intermediate outer surface 822i and the patterned top electrode 826 has an intermediate outer surface 826i that are defined by the first etch 804. The patterned top electrode 826 may have a first thickness $t_1$ after the first etch 804. The first thickness $t_1$ may be in a range of between approximately 50 nanometers and approximately 300 nanometers. In some embodiments, the first etch 804 may be a dry, plasma etch (e.g., RF plasma-based etch). In other embodiments, the first etch 804 may be a wet etch. The first etch 804 is selective to the materials of the patterned bottom electrode 822, ferroelectric layer 114, and patterned top electrode 826. In some embodiments, the first etch 804 causes the ferroelectric layer 114 to have a damaged region 114d along its outermost sidewalls 114s. In other words, the first etch 804 may cause damage to any exposed areas of the ferroelectric layer 114.

Because the crystal structure of the ferroelectric layer 114 contributes to data storage in the final FeRAM cell (101 of FIG. 1A), damage to the crystal structure of the damaged region 114d of the ferroelectric layer 114 from the first etch 804 would result in an unreliable FeRAM device. In some embodiments, damage to the crystal structure at the damaged region 114d from the first etch 804 (e.g., plasma etch), may include, for example, loss of a ferroelectric crystal structure, biased crystal structure orientations, dislocations, vacancies, dangling bonds, or the like. The damaged region 114d may extend from the outermost sidewalls 114s of the ferroelectric layer 114 to a second distance $d_2$. The second distance $d_2$, in some embodiments, may be in a range of between approximately 5 nanometers and approximately 10 nanometers.

Figure 8D:
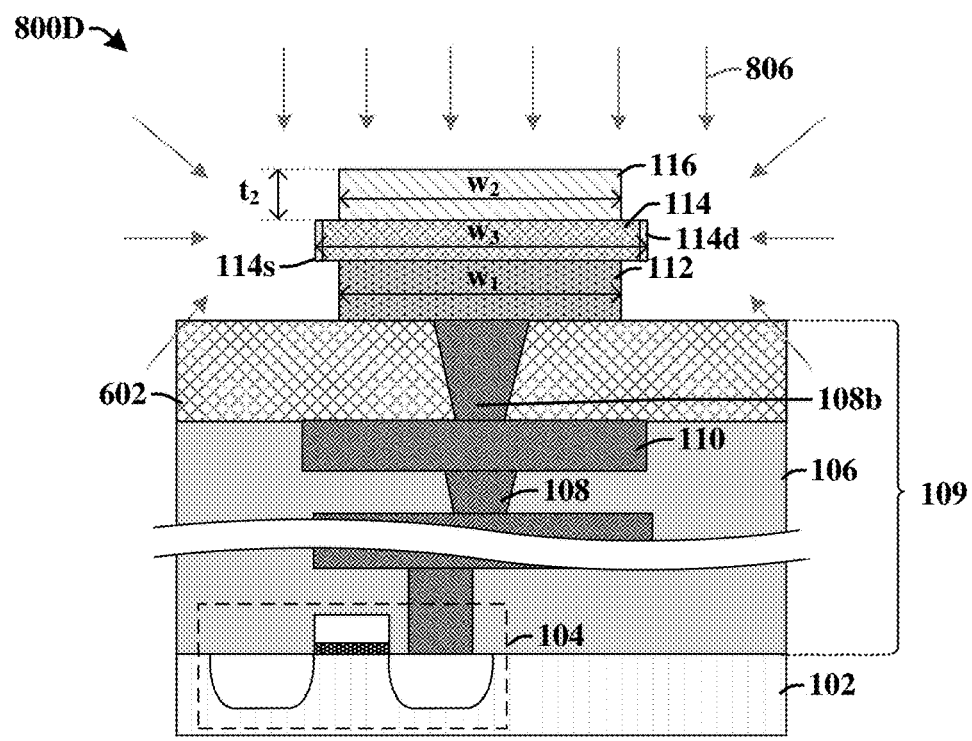

As shown in cross-sectional view 800D of FIG. 8D, the first mask (802 of FIG. 8C) is removed, and a second etch 806 is performed to define a bottom electrode 112 and a top electrode 116. The second etch 806 is highly selective to the patterned bottom electrode (822 of FIG. 8C) and the patterned top electrode (826 of FIG. 8C), thereby removing a greater amount of the patterned bottom electrode (822 of FIG. 8C) and the patterned top electrode (826 of FIG. 8C) than the ferroelectric layer 114. In some embodiments, the second etch 806 is highly selective to the patterned bottom electrode (822 of FIG. 8C) and the patterned top electrode (826 of FIG. 8C) compared to the ferroelectric layer 114 because the patterned bottom electrode (822 of FIG. 8C) and the patterned top electrode (826 of FIG. 8C) comprise the same material which is different than the material of the ferroelectric layer 114. Thus, in some embodiments, during the second etch 806, the ferroelectric layer 114 remains substantially unaffected. The etch stop layer 602 is also substantially unaffected by the second etch 806, and therefore protects the bottom electrode via 108b during the second etch 806.

In some embodiments, the second etch 806 may be a wet etch, such as, for example, an organic solvent (e.g., methanol) or an aqueous solution of ammonium hydroxide and hydrogen peroxide. In other embodiments, the second etch 806 may be a dry etch, such as, for example, a sputter etch, a chemical etch, an ion-enhanced etch, an RF plasma-based etch. In some embodiments, when the second etch 806 is a chemical etch, the second etch 806 is isotropic and because of fluxes from the chemical species, the second etch 806 has a wide arrival angle distribution. In other words, the second etch 806 effectively targets and laterally removes outer portions of the patterned bottom electrode (822 of FIG. 8C), including the intermediate outer surface (822i of FIG. 8C) of the patterned bottom electrode (822 of FIG. 8C), to form the bottom electrode 112. The second etch 806 also effectively targets and laterally removes outer portions of the patterned top electrode (826 of FIG. 8C), including the intermediate outer surface (826*i* of FIG. 8C) of the patterned top electrode (826 of FIG. 8C), to form the top electrode 116. In some embodiments, the second etch 806 also removes top portions of the patterned top electrode (826 of FIG. 8C), such that the top electrode 116 has a second thickness $t_2$ is less than the first thickness $t_1$. In some embodiments, the second thickness $t_2$ is less than the first thickness $t_1$ by approximately 5 nanometers to approximately 10 nanometers.

After the second etch 806, the bottom electrode 112 has a first width $w_1$ measured as a maximum distance between outermost sidewalls of the bottom electrode 112. The top electrode 116 has a second width $w_2$ measured as a maximum distance between outermost sidewalls of the top electrode 116. The ferroelectric layer 114 has a third width $w_3$ measured as a maximum distance between outermost sidewalls of the ferroelectric layer 114. In some embodiments, after the second etch, the third width $w_3$ is greater than the first width $w_1$ and the second width $w_2$. In some embodiments, the third width $w_3$ may be greater than the first width $w_1$ by a measurement in a range of between approximately 5 nanometers and approximately 10 nanometers. In some embodiments, the third width $w_3$ may be greater than the second width $w_2$ by a measurement in a range of between approximately 5 nanometers and approximately 10 nanometers. Thus, in some embodiments, the second etch 806 removes at least outer portions of the patterned bottom electrode (822 of FIG. 8C) and outer portions of the patterned top electrode (826 of FIG. 8C) that vertically surround the damaged region 114*d* of the ferroelectric layer 114 from the first etch 804. Thus, in some embodiments, the difference between the third width $w_3$ and the second width $w_2$, and/or the difference between the third width $w_3$ and the first width $w_1$ is at least equal to the second distance ($d_2$ of FIG. 8C). In some embodiments, outermost sidewalls of the top electrode 116 and the bottom electrode 112 are substantially aligned, whereas in other embodiments, the outermost sidewalls of the top electrode 116 and the bottom electrode 112 may be misaligned, due to non-uniform etching rates of the second etch 806. For example, in some embodiments, the first width $w_1$ may be greater than the second width $w_2$. After the second etch 806, the damaged region 114*d* of the ferroelectric layer 114 does not contact the top and bottom electrodes 116, 112.

Figure 9A:
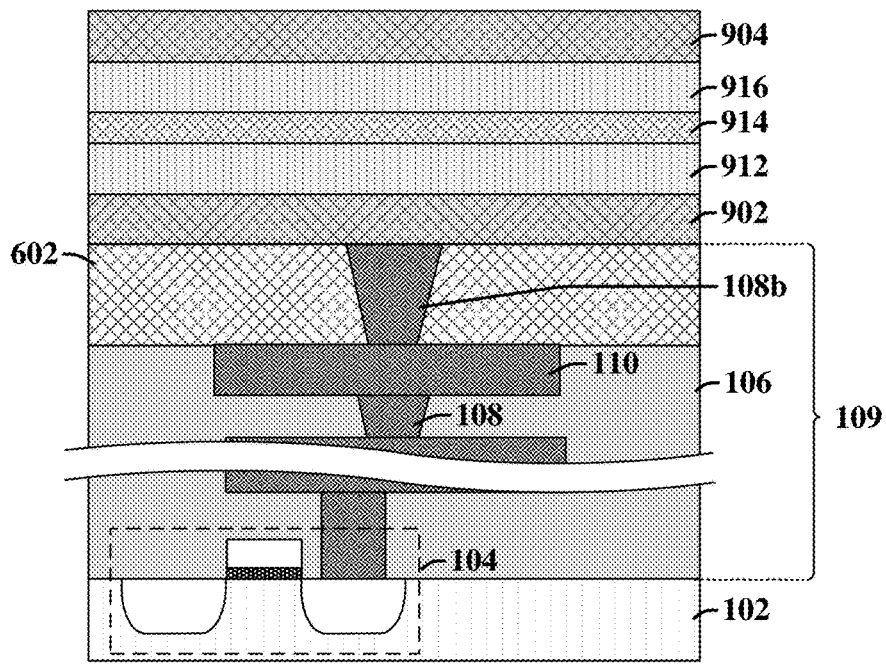

FIGS. 9A-9D illustrate cross-sectional views 900A-900D of some embodiments of a method of forming the FeRAM cell of FIG. 2A. FIG. 9A proceeds from FIG. 7 (skipping the acts at FIGS. 8A-8D).

As shown in the cross-sectional view 900A of FIG. 9A, a first material of the bottom electrode layer 902 is deposited over the etch stop layer 602 and the bottom electrode via 108*b*. A second material of the bottom electrode layer 912 is deposited over the first material of the bottom electrode layer 902. A ferroelectric material 914 is then deposited over the second material of the bottom electrode layer 912. In some embodiments, the ferroelectric material 914 comprises a ferroelectric material, such as, for example, strontium bismuth tantalite, lead zirconate titanate, hafnium zirconium oxide, doped hafnium oxide, or the like. In some embodiments, the ferroelectric material 914 may have a thickness in a range of between approximately 10 angstroms and approximately 200 angstroms. In some embodiments, the ferroelectric material 914 may be formed by an atomic layer deposition process. In some embodiments, a first material of the top electrode layer 904 over a second material of the top electrode layer 916 may be deposited over the ferroelectric material 914. In some embodiments, the first and second materials of the bottom electrode layers 902, 912 and the first and second materials of the top electrode layers 904, 916 may be formed using a deposition process and/or a plating process (e.g., electroplating, electro-less plating, etc.). In some embodiments, the first and second materials of the bottom electrode layers 902, 912 and the first and second materials of the top electrode layers 904, 916 may each comprise, for example, titanium nitride, tantalum nitride, tungsten, ruthenium, iridium, or the like. In some embodiments, the first material of the top electrode layer 904 and the first material of the bottom electrode layer 902 may comprise a first material, whereas the second material of the top electrode layer 916 and the second material of the bottom electrode layer 912 may comprise a second material that is different from the first material. In other embodiments, the first material of the bottom electrode layer 902, the second material of the bottom electrode layer 912, the first material of the top electrode layer 904, and the second material of the top electrode layer 916 may each comprise different materials, the same materials, or combinations thereof. In some embodiments, the first material of the bottom electrode layer 902 and the first material of the top electrode layer 904 may each have a thickness in a range of between approximately 100 nanometers and approximately 300 nanometers. In some embodiments, the second material of the bottom electrode layer 912 and the second material of the top electrode layer 916 may each have a thickness in a range of between approximately 50 nanometers and approximately 300 nanometers.

Figure 9B:
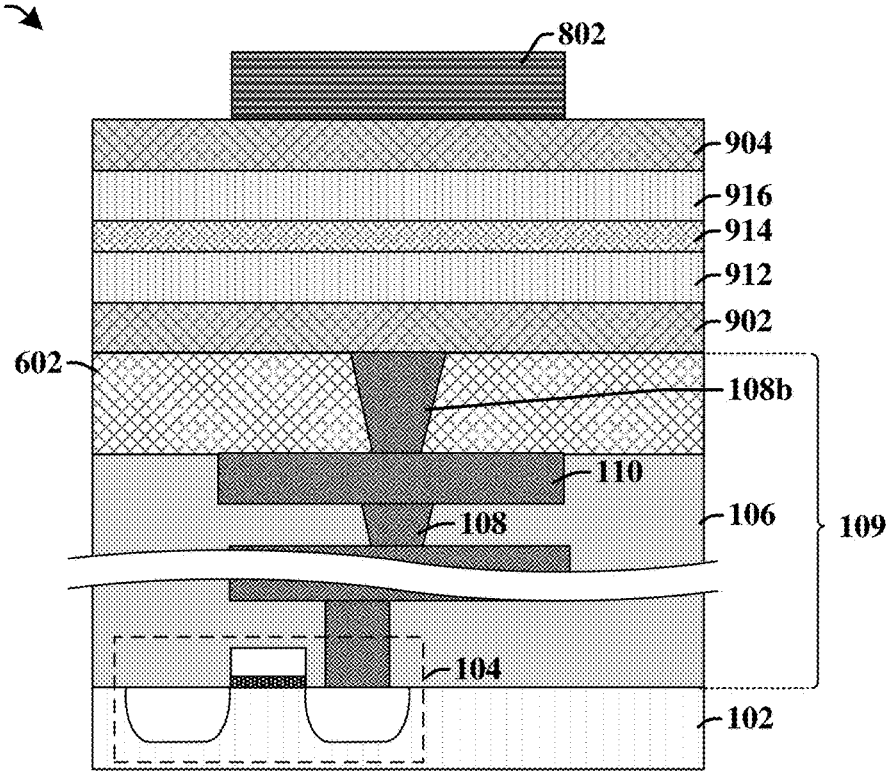

As shown in the cross-sectional view 900B of FIG. 9B, a first mask 802 is formed over the first material of the top electrode layer 904. In some embodiments, the first mask 802 in the cross-sectional view 900B exhibits the same characteristics as the first mask 802 in the cross-sectional view 800B of FIG. 8B.

Figure 9C:
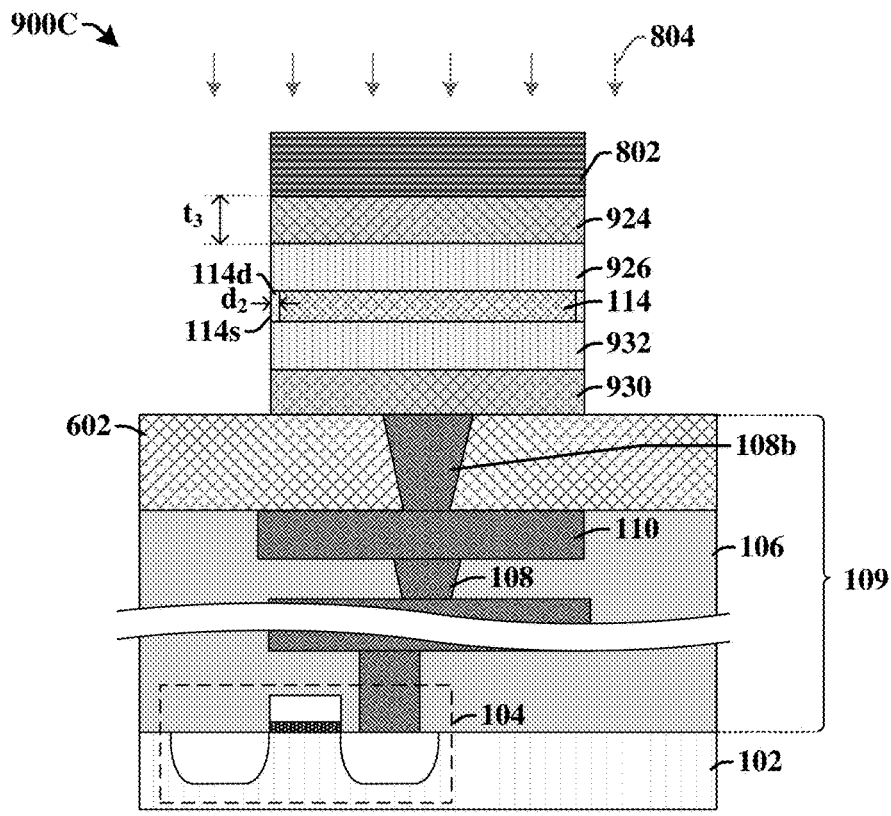

As shown in the cross-sectional view 900C of FIG. 9C, a first etch 804 is performed according to the first mask 802, thereby removing portions of the first and second materials of the top electrode layers 904, 916, the ferroelectric material 914, and the first and second materials of the bottom electrode layers 902, 912 that were uncovered by the mask in FIG. 9B and forming a patterned first layer of the top electrode 924, a patterned second layer of the top electrode 926, a ferroelectric layer 114, a patterned first layer of the bottom electrode 930, and a patterned second layer of the bottom electrode 932. The first etch 804 in the cross-sectional view 900C exhibits at least similar characteristics as the first etch 804 in the cross-sectional view 800C of FIG. 8C. In addition, the first etch 804 in the cross-sectional view 900C is selective to the materials of the patterned first and second layers of the bottom electrodes 930, 932, the patterned first and second layers of the top electrodes 924, 926, and the ferroelectric layer 114. After the first etch 804, the patterned second layer of the top electrode 926 may have a third thickness $t_3$. In some embodiments, the first etch 804 causes the ferroelectric layer 114 to have a damaged region 114*d* at its outermost sidewalls 114*s*. Damage to the crystal structure of the damaged region 114*d* may extend from the outermost sidewalls 114*s* of the ferroelectric layer 114 to a second distance $d_2$. The second distance $d_2$, in some embodiments, may be in a range of between approximately 5 nanometers and approximately 10 nanometers.

Figure 9D:
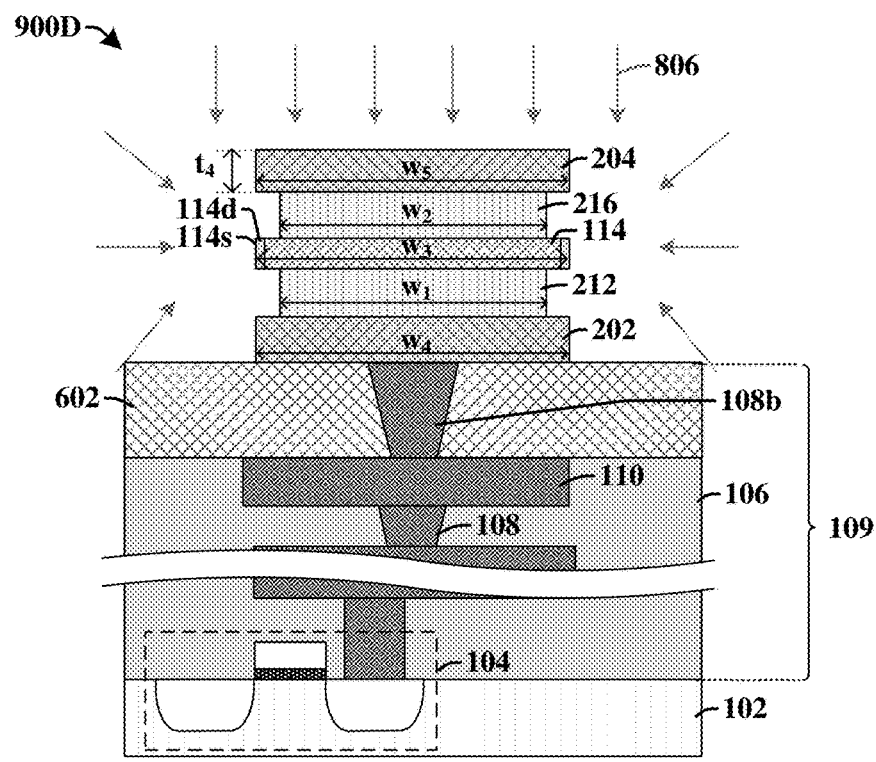

As shown in the cross-sectional view 900D of FIG. 9D, the first mask (802 of FIG. 9C) is removed, and a second etch 806 is performed. The second etch 806 in the cross-sectional view 900D exhibits similar characteristics to the second etch 806 in the cross-sectional view 800D of FIG. 8D. In some embodiments, the second etch 806 in the cross-sectional view 900D is highly selective to materials of the patterned second layer of the bottom and top electrodes (932, 926 of FIG. 9C), thereby forming a second layer of the bottom electrode 212 and a second layer of the top electrode 216. In some embodiments, the materials of the patterned second layer of the bottom and top electrodes (932, 926 of FIG. 9C) are the same. In other words, the second etch 806 is configured (as described in the description of FIG. 8D) to effectively target and laterally remove outer portions of the patterned second layer of the bottom electrode (932 of FIG. 9C) and the patterned second layer of the top electrode (926 of FIG. 9C) to form the second layer of the bottom electrode 212 and the second layer of the top electrode 216. In addition, the second etch 806 may, in some embodiments, remove upper portions of the patterned first layers of the bottom and top electrodes (930, 924 of FIG. 9C), thereby forming a first layer of the bottom electrode 202 and a first layer of the top electrode 204. For example, the first layer of the top electrode 204 may have a fourth thickness $t_4$ after the second etch 806. In some embodiments, the fourth thickness $t_4$ may be less than the third thickness ($t_3$ of FIG. 9C) due to vertical residual etching effects of the second etch 806. In such embodiments, the difference between the fourth thickness $t_4$ and the third thickness ($t_3$) may be in a range of between approximately 5 nanometers and approximately 10 nanometers. In other embodiments, the patterned first layers of the bottom and top electrodes (930, 924 of FIG. 9C) may be substantially unaffected by the second etch 806.

After the second etch 806, the second layer of the bottom electrode 212 has a first width $w_1$ measured as a maximum distance between outermost sidewalls of the second layer of the bottom electrode 212. The second layer of the top electrode 216 has a second width $w_2$ measured as a maximum distance between outermost sidewalls of the second layer of the top electrode 216. The ferroelectric layer 114 has a third width $w_3$ measured as a maximum distance between outermost sidewalls of the ferroelectric layer 114. In some embodiments, after the second etch, the third width $w_3$ is greater than the first width $w_1$ and the second width $w_2$. In some embodiments, the third width $w_3$ may be greater than the first width $w_1$ by a measurement in a range of between approximately 5 nanometers and approximately 10 nanometers. In some embodiments, the third width $w_3$ may be greater than the second width $w_2$ by a measurement in a range of between approximately 5 nanometers and approximately 10 nanometers. Thus, in some embodiments, the second etch 806 removes at least outer portions of the patterned second layer of the bottom electrode (932 of FIG. 9C) and outer portions of the patterned second layer of the top electrode (926 of FIG. 9C) that vertically surround the damaged region 114d of the ferroelectric layer 114 from the first etch 804. Thus, in some embodiments, the difference between the third width $w_3$ and the second width $w_2$, and/or the difference between the third width $w_3$ and the first width $w_1$ is at least equal to the second distance ($d_2$ of FIG. 9C). In some embodiments, outermost sidewalls of the second layer of the top electrode 216 and the second layer of the bottom electrode 212 are substantially aligned, whereas in other embodiments, the outermost sidewalls of the second layer of the top electrode 216 and the second layer of the bottom electrode 212 may be misaligned, due to non-uniform etching rates of the second etch 806. For example, in some embodiments, the first width $w_1$ may be greater than the second width $w_2$. After the second etch 806, the damaged region 114d of the ferroelectric layer 114 does not contact the second layers of the top and bottom electrodes 216, 212.

Further, in some embodiments, after the second etch 806, the first layer of the bottom electrode 202 has a fourth width $w_4$ measured as a maximum distance between outermost sidewalls of the first layer of the bottom electrode 202. The first layer of the top electrode 204 has a fifth width $w_5$ measured as a maximum distance between outermost sidewalls of the first layer of the top electrode 204. In some embodiments, after the second etch 806, the fourth width $w_4$ is greater than the first width $w_1$ and the second width $w_2$. Similarly, in some embodiments, the fifth width $w_5$ is greater than the first width $w_1$ and the second width $w_2$. In some embodiments, the fourth width $w_4$ is equal to the fifth width $w_5$, and the third width $w_3$ is less than the fourth and fifth widths $w_4$, $w_5$. In such embodiments, the difference between the fifth width $w_5$ and the third width $w_3$ and the difference between the fourth width $w_4$ and the third width $w_3$ may be in a range of between approximately 0 nanometers and approximately 10 nanometers. In other embodiments, the third width $w_3$, the fourth width $w_4$ and the fifth width $w_5$ may be about equal to one another. Nevertheless, the damaged region 114d of the ferroelectric layer 114 is not in contact with the second layers of the top and bottom electrodes 216, 212, and thus, a final FeRAM device having a structure as in the cross-sectional view 900D of FIG. 9D would not rely on the damaged region 114d of the ferroelectric layer 114 for data storage.

Figure 10A:
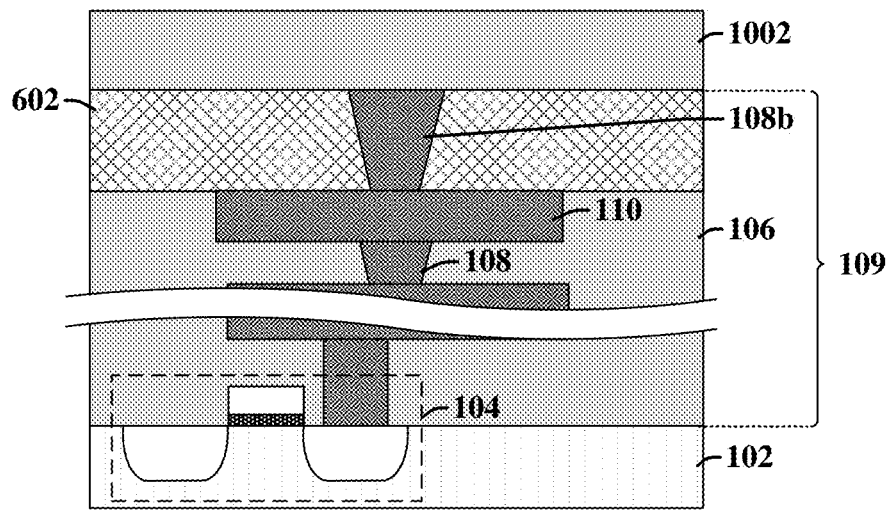

FIGS. 10A-10E illustrate cross-sectional views 1000A-1000E of some embodiments of a method of forming the FeRAM cell of FIG. 3. FIG. 10A proceeds FIG. 7 (skipping the acts at FIGS. 8A-8D and FIGS. 9A-9D).

As shown in the cross-sectional view 1000A of FIG. 10A, an upper dielectric layer 1002 is deposited over the etch stop layer 602 and the bottom electrode via 108b. In some embodiments, the upper dielectric layer 1002 comprises the same material as the dielectric structure 106. Similarly, the upper dielectric layer 1002 may be deposited by a physical vapor deposition technique (e.g., PVD, CVD, PE-CVD, ALD, etc.).

Figure 10B:
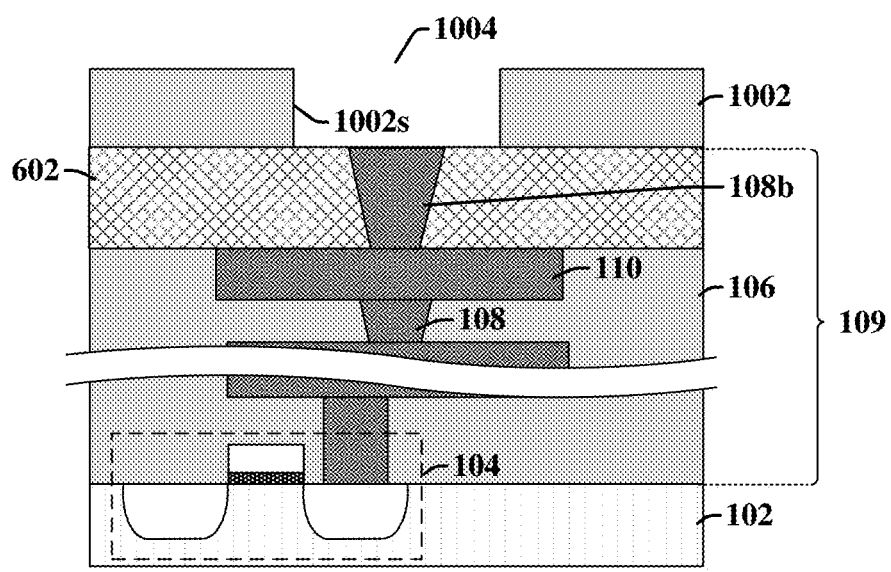

As shown in the cross-sectional view 1000B of FIG. 10B, the upper dielectric layer 1002 is patterned to define a cavity 1004 in the upper dielectric layer 1002. The upper dielectric layer 1002 may be patterned using photolithography and etching techniques. The upper dielectric layer 1002 has inner sidewalls 1002s that define the cavity 1004. A bottom surface of the cavity 1004 exposes the bottom electrode via 108b.

Figure 10C:
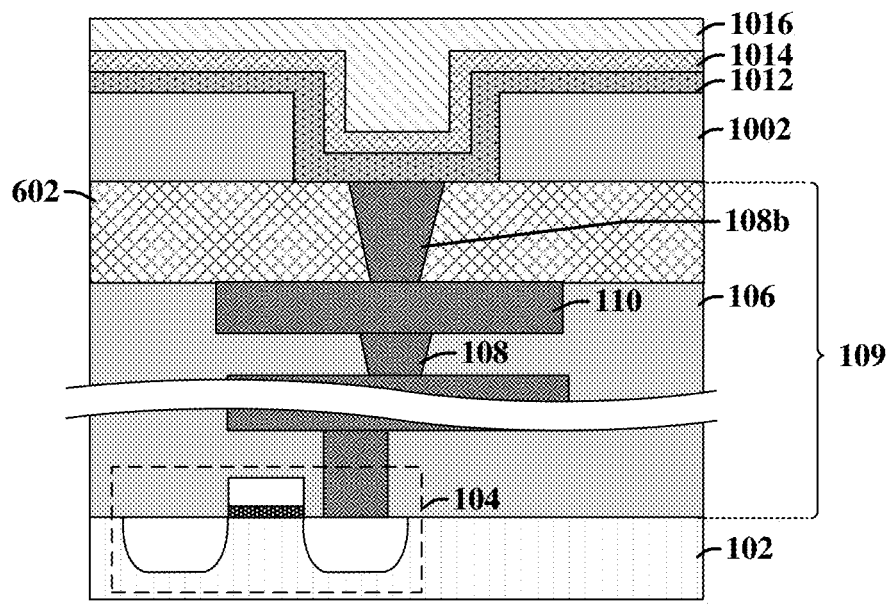
Figure 10D:
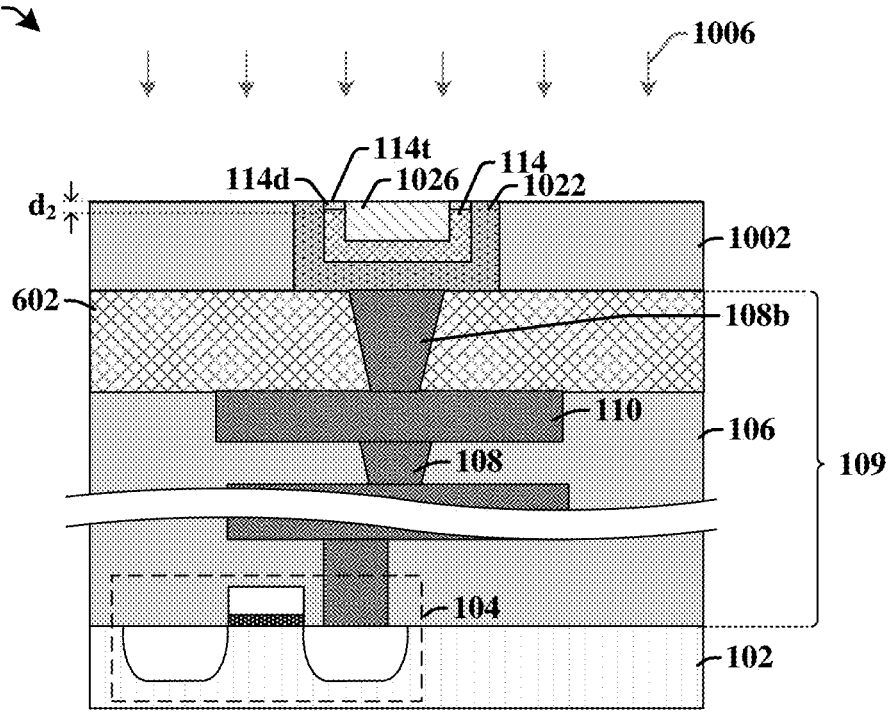
Figure 10E:
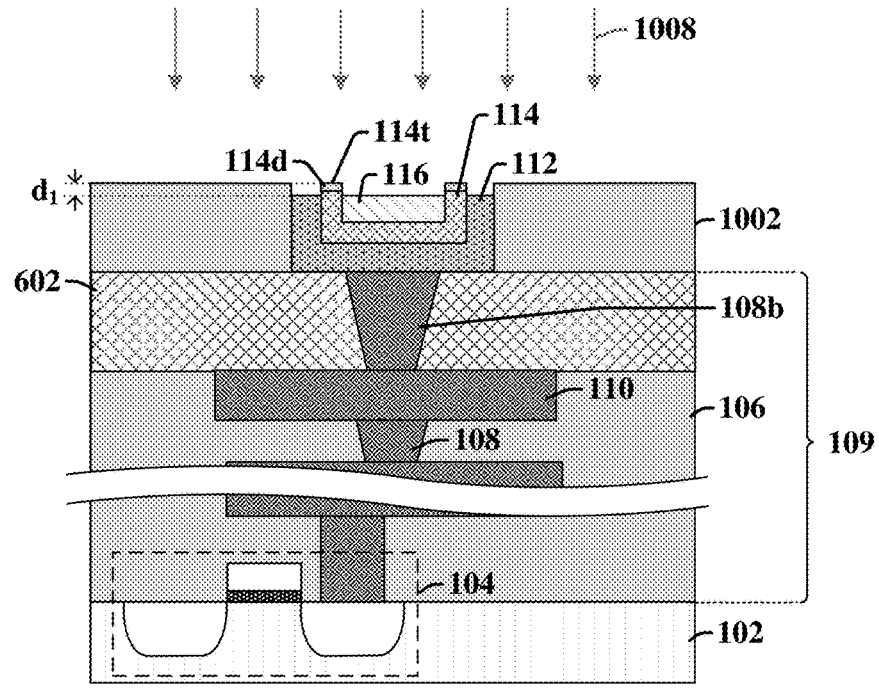

As shown in the cross-sectional view 1000C of FIG. 10C, a conformal bottom electrode layer 1012 is deposited over the upper dielectric layer 1002 and within the cavity (1004 of FIG. 10B). In some embodiments, the conformal bottom electrode layer 1012 has a thickness in a range of between approximately 100 nanometers and approximately 1 micrometer. A conformal ferroelectric layer 1014 is deposited over the conformal bottom electrode layer 1012. In some embodiments, the conformal ferroelectric layer 1014 has a thickness in a range of between approximately 10 angstroms and approximately 200 angstroms. A conformal top electrode layer 1016 is deposited over the conformal ferroelectric layer 1014. In some embodiments, the conformal top electrode layer 1016 has a thickness in a range of between approximately 200 nanometers and approximately 2 micrometer. In some embodiments, the conformal top electrode layer 1016 may be formed to have substantially planar top surfaces. In some embodiments, the conformal top and bottom electrodes 1016, 1012 may be formed using a deposition process and/or a plating process (e.g., electroplating, electro-less plating, etc.). In some embodiments, the conformal bottom electrode layer 1012 and the conformal top electrode layer 1016 may each comprise, for example, titanium nitride, tantalum nitride, tungsten, ruthenium, iridium, or the like. In some embodiments, the conformal top electrode layer 1016 and the conformal bottom electrode layer 1012 may comprise the same material, whereas in other embodiments, the conformal top electrode layer 1016 and the conformal bottom electrode layer 1012 may comprise different materials.

As shown in the cross-sectional view 1000D, a removal step 1006 is performed to remove portions of the conformal bottom electrode layer (1012 of FIG. 10C), the conformal ferroelectric layer (1014 of FIG. 10C), and the conformal top electrode layer (1016 of FIG. 10C). After the removal step 1006, a conformal top electrode 1026, a ferroelectric layer 114, a conformal bottom electrode 1022, and the upper dielectric layer 1002 have substantially co-planar top surfaces. In some embodiments, the removal step 1006 may be a planarization process (e.g., chemical mechanical planarization) or a vertical etch (e.g., wet etch, dry etch). In some embodiments, the removal step 1006 causes the ferroelectric layer 114 to have a damaged region 114*d* at its topmost surfaces 114*t*. The damaged region 114*d* of the ferroelectric layer 114 has damage to its crystal structure, causing the ferroelectric properties of the damaged region 114*d* to be unreliable. The damaged region 114*d* of the ferroelectric layer 114 may extend from the topmost surfaces 114*t* of the ferroelectric layer 114 to a second distance dz. The second distance $d_2$, in some embodiments, may be in a range of between approximately 5 nanometers and approximately 10 nanometers.

As shown in the cross-sectional view 1000E, a third etch 1008 is performed that is selective to the material of the conformal top electrode (1026 of FIG. 1000D) and of the conformal bottom electrode (1022 of FIG. 1000D). The third etch 1008 does not remove portions of the ferroelectric layer 114. In some embodiments, the third etch 1008 may be a wet etch, such as, for example, an organic solvent (e.g., methanol) or an aqueous solution of ammonium hydroxide and hydrogen peroxide. In other embodiments, the third etch 1008 may be a dry etch, such as, for example, a sputter etch, a chemical etch, an ion-enhanced etch, an RF plasma-based etch. After the third etch 1008, a top electrode 116 and a bottom electrode 112 have topmost surfaces that are below topmost surfaces 114*t* of the ferroelectric layer 114 by a first distance $d_1$. The first distance $d_1$ is at least equal to the second distance $d_2$, such that in some embodiments, the third etch 1008 removes portions of the conformal top electrode (1026 of FIG. 1000D) and of the conformal bottom electrode (1022 of FIG. 1000D) so that the damaged region 114*d* of the ferroelectric layer 114 is not in contact with the top electrode 116 and bottom electrode 112. Thus, the damaged region 114*d* of the ferroelectric layer 114 from the removal step 1006 is not involved in the data storage of the final FeRAM device.

Figure 11A:
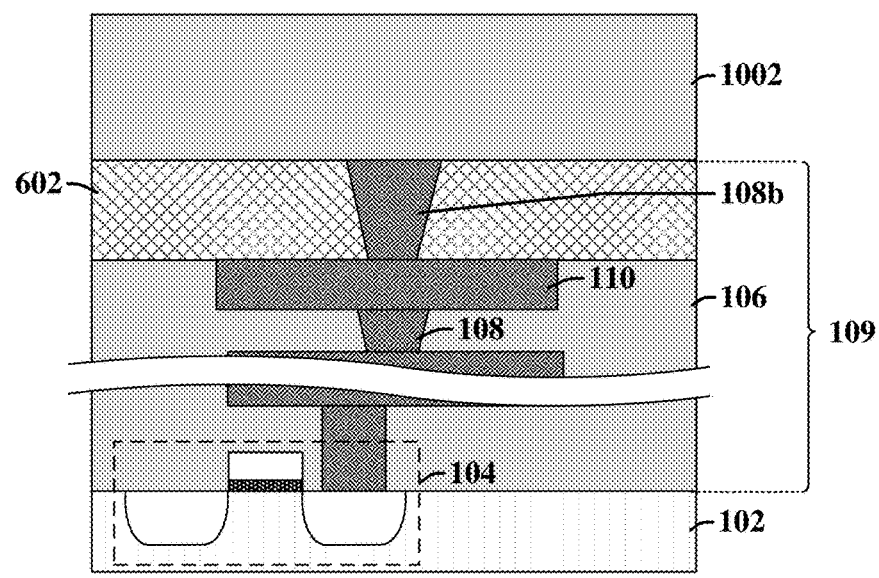

FIGS. 11A-11E illustrate cross-sectional views 1100A-1100E of some embodiments of a method of forming the FeRAM cell of FIG. 4. FIG. 11A proceeds from FIG. 7 (skipping the acts at FIGS. 8A-8D, FIGS. 9A-9D, and FIGS. 10A-10E).

As shown in the cross-sectional view 1100A of FIG. 11A, an upper dielectric layer 1002 is deposited over the etch stop layer 602 and the bottom electrode via 108*b*. The upper dielectric layer 1002 in the cross-sectional view 1100A exhibits similar characteristics as the upper dielectric layer 1002 in the cross-sectional view 1000A of FIG. 10A.

Figure 11B:
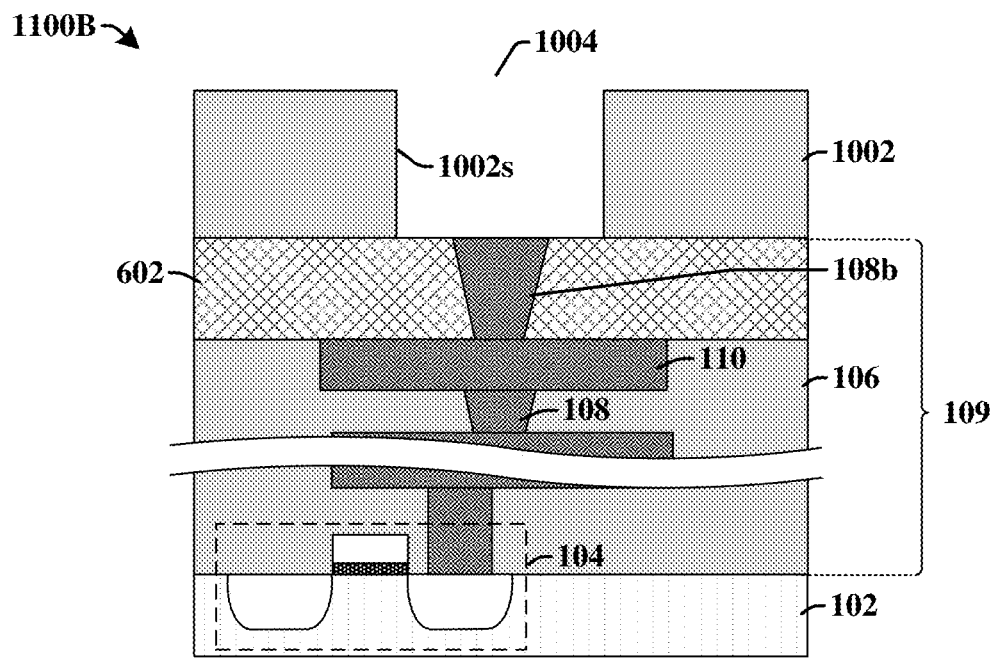

As shown in the cross-sectional view 1100B of FIG. 11B, the upper dielectric layer 1002 is patterned to define a cavity 1004 in the upper dielectric layer 1002. The upper dielectric layer 1002 may be patterned using photolithography and etching techniques. Like the upper dielectric layer 1002 in the cross-sectional view 1000B of FIG. 10B, the upper dielectric layer 1002 in the cross-sectional view 1100B has inner sidewalls 1002*s* that define the cavity 1004. A bottom surface of the cavity 1004 exposes the bottom electrode via 108*b*.

Figure 11C:
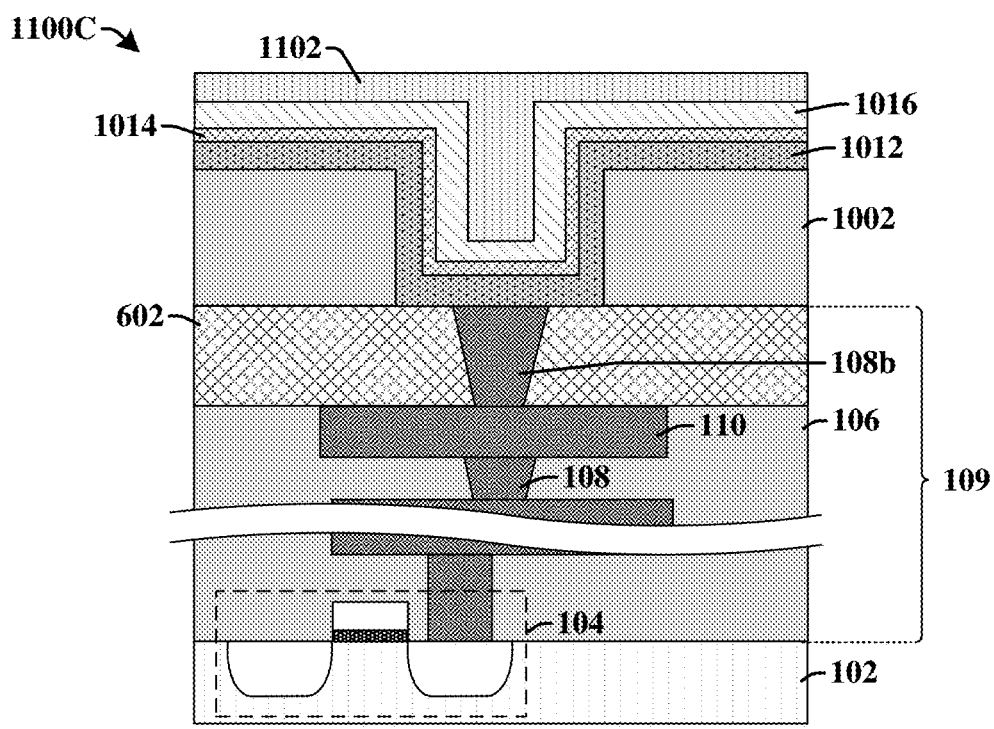

As shown in the cross-sectional view 1100C of FIG. 11C, the same steps in the cross-sectional view 1000C of FIG. 10C are followed, with an additional deposition of an additional conformal top electrode layer 1102 over the conformal top electrode layer 1016. Thus, in the cross-sectional view 1100C, the deposition of the conformal bottom electrode layer 1012, the conformal ferroelectric layer 1014 and the conformal top electrode layer 1016 into the cavity (1004 of FIG. 11B) as described in the FIG. 10C description is performed. Then, the additional conformal top electrode layer 1102 is deposited over the conformal top electrode layer 1016. In some embodiments, the additional conformal top electrode layer 1102 has a substantially planar top surface. In some embodiments, the conformal bottom electrode layer 1012 has a thickness in a range of between approximately 100 nanometers and approximately 1 micrometer. In some embodiments, the conformal ferroelectric layer 1014 has a thickness in a range of between approximately 10 angstroms and approximately 200 angstroms. In some embodiments, the conformal top electrode layer 1016 has a thickness in a range of between approximately 100 nanometers and approximately 1 micrometer. In some embodiments, the additional conformal top electrode layer 1102 has a thickness in a range of between approximately 200 nanometers and approximately 2 micrometers. In some embodiments, like the conformal top and bottom electrodes 1016, 1012, the additional conformal top electrode layer 1102 may be formed using a deposition process and/or a plating process (e.g., electroplating, electro-less plating, etc.).

In some embodiments, the conformal bottom electrode layer 1012 and the conformal top electrode layer 1016 may each comprise, for example, titanium nitride, tantalum nitride, tungsten, ruthenium, iridium, or the like. In some embodiments, the conformal top electrode layer 1016 and the conformal bottom electrode layer 1012 may comprise the same material, whereas in other embodiments, the conformal top electrode layer 1016 and the conformal bottom electrode layer 1012 may comprise different materials. In some embodiments, the additional conformal top electrode layer 1102 may comprise a different material than both the conformal top and bottom electrode layers 1016, 1012. In some embodiments, the additional conformal top electrode layer 1102 may comprise, for example, titanium nitride, tantalum nitride, tungsten, ruthenium, iridium, or the like.

Figure 11D:
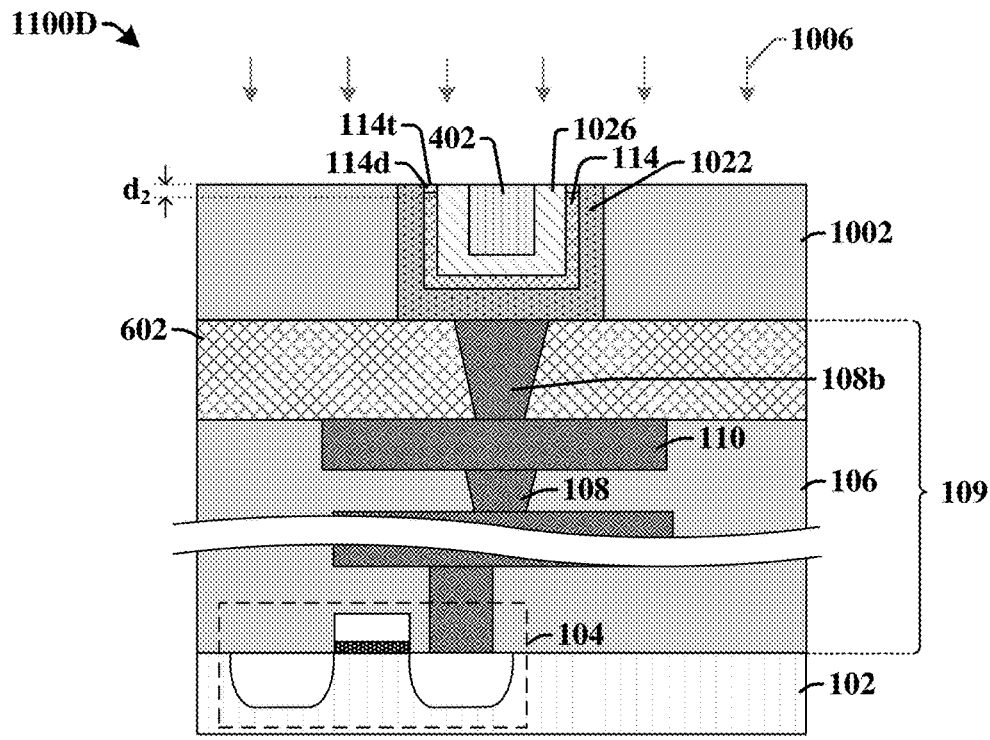

As shown in the cross-sectional view 1100D of FIG. 11D, a removal step 1006 is performed. The removal step 1006 in the cross-sectional view 1100D of FIG. 11D comprises the same features as the removal step 1006 in the cross-sectional view 1000D of FIG. 10D. In addition, the removal step 1006 in the cross-sectional view 1100D also removes portions of additional conformal top electrode layer (1102 of FIG. 11C), such that after the removal step 1006, a conformal bottom electrode 1022, a ferroelectric layer 114, a conformal top electrode 1026, the upper dielectric layer 1002, an additional layer of the top electrode 402 have top surfaces that are substantially co-planar. In some embodiments, the removal step 1006 may cause the ferroelectric layer 114 to have a damaged region 114d at its topmost surfaces 114t. The damaged region 114d has damage to its crystal structure, causing the ferroelectric properties of the damaged region 114d to be unreliable. Damage to the crystal structure of the damaged region 114d may extend from the topmost surfaces 114t of the ferroelectric layer 114 to a second distance $d_2$. The second distance $d_2$, in some embodiments, may be in a range of between approximately 5 nanometers and approximately 10 nanometers.

Figure 11E:
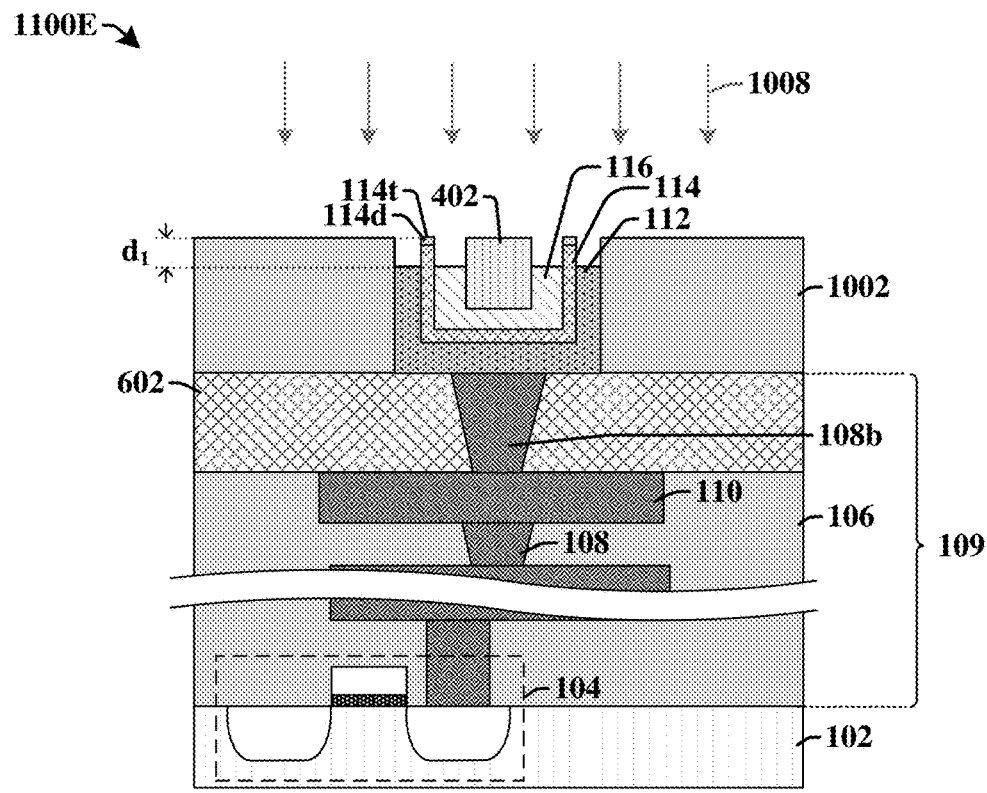

As shown in the cross-sectional view 1100E of FIG. 11E, a third etch 1008 is performed that is selective to the material of the conformal top electrode (1026 of FIG. 1100D) and of the conformal bottom electrode (1022 of FIG. 1100D). The third etch 1008 in the cross-sectional view 1100E comprises the same characteristics as the third etch 1008 in the cross-sectional view 1000E. In addition, in some embodiments, the third etch 1008 in the cross-sectional view 1100E of FIG. 11E does not remove portions of the additional layer of the top electrode 402. In other embodiments, small portions of top surfaces of the additional layer of the top electrode 402 may be removed due to residual effects from the third etch 1008. In some embodiments, a topmost surface of the additional layer of the top electrode 402 is above the topmost surfaces of the top electrode 116. In some embodiments, the top electrode 116 and the ferroelectric layer 114 have substantially aligned topmost surfaces. In other embodiments (not shown), the topmost surface of the additional layer of the top electrode 402 may be substantially co-planar with topmost surfaces of the top electrode 116.

After the third etch 1008, the bottom electrode 112 and the top electrode 116 have topmost surfaces that are below the topmost surfaces 114t of the ferroelectric layer 114 by a first distance $d_1$. The first distance $d_1$ is at least equal to the second distance $d_2$, such that in some embodiments, the third etch 1008 removes portions of the conformal top electrode (1026 of FIG. 1100D) and of the conformal bottom electrode (1022 of FIG. 1100D) so that the damaged region 114d of the ferroelectric layer 114 that extends from the topmost surfaces 114t of the ferroelectric layer 114 is not in direct contact with the top electrode 116 and bottom electrode 112. Thus, the damaged region 114d of the ferroelectric layer 114 from the removal step 1006 is not involved in the data storage of the final FeRAM device, such that because of the third etch 1008, the final FeRAM device is more reliable.

Figure 12:
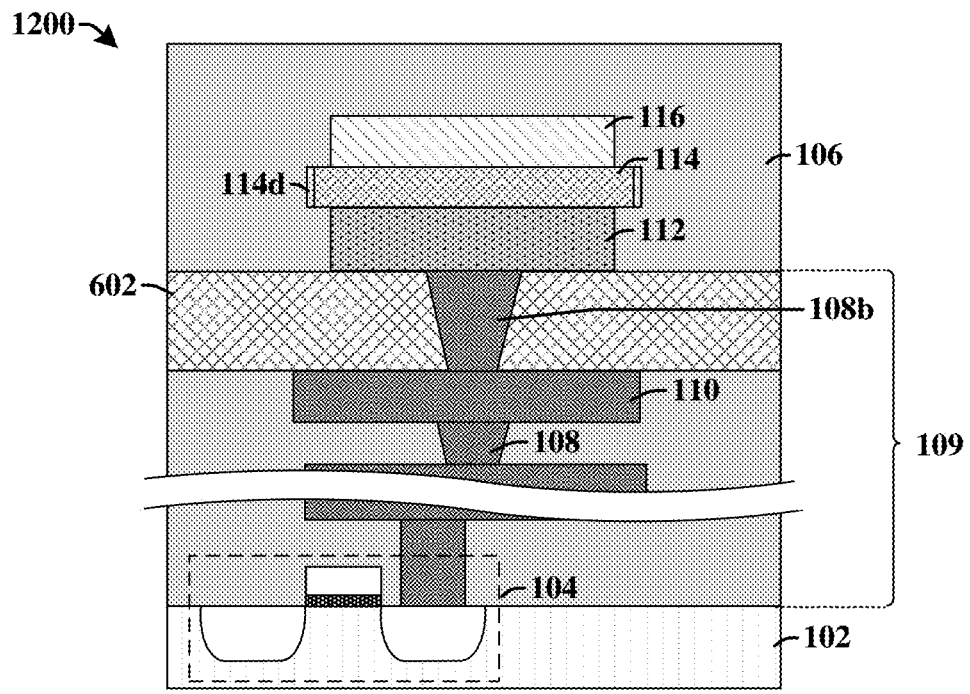
Figure 13:
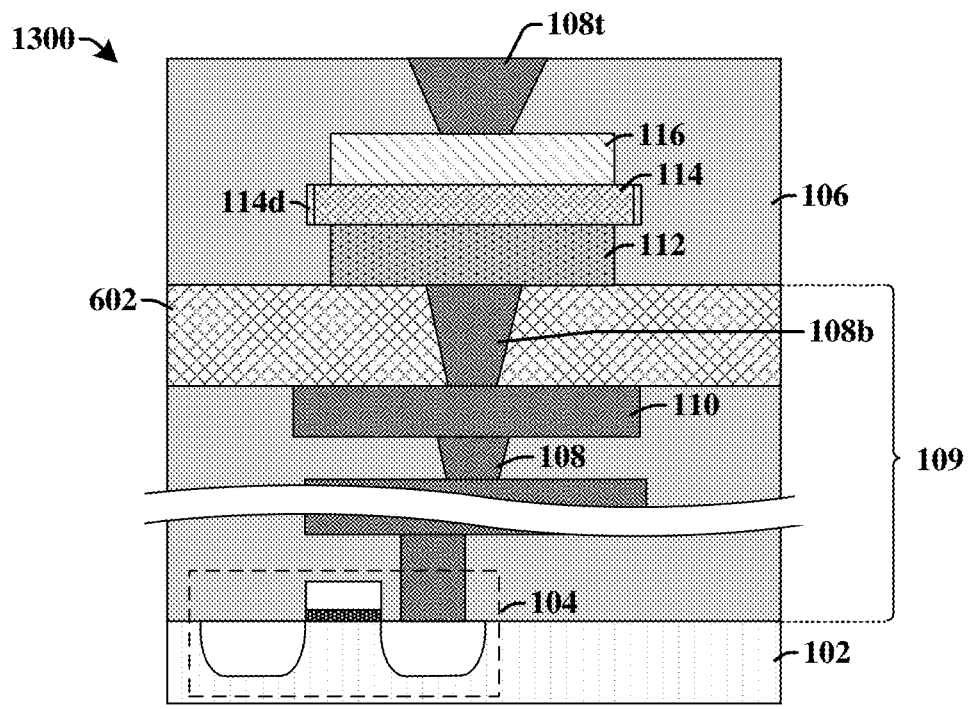

FIGS. 12-13 illustrate cross-sectional views 1200-1300 of some embodiments of a method of forming a dielectric structure and top electrode via over the FeRAM cell 101 of FIG. 1A. FIG. 12 proceeds from FIG. 8D (skipping the acts at FIGS. 9A-9D, FIGS. 10A-10E, and FIGS. 11A-11E). It will be appreciated that the steps in FIGS. 12-13 are not limiting to the embodiment of FIG. 8D, and may also be applied to the embodiments in FIG. 9D, FIG. 10E, and FIG. 11E to form a top electrode via and dielectric structure over a FeRAM cell.

As shown in the cross-sectional view 1200 of FIG. 12, the dielectric structure 106 is deposited over the top electrode 116, such that the dielectric structure 106 surrounds the bottom electrode 112, the ferroelectric layer 114 and the top electrode 116. In some embodiments, the dielectric structure 106 may comprise for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the dielectric structure 106 may be deposited by a physical vapor deposition technique (e.g., PVD, CVD, PE-CVD, ALD, etc.).

As shown in the cross-sectional view 1300 of FIG. 13, the dielectric structure 106 is patterned and a conductive material is deposited to form a top electrode via 108t that is coupled to the top electrode 116. Like the formation of the bottom electrode via 108b, in some embodiments, the top electrode via 108t may be formed using a damascene process (e.g., a single damascene process or a dual damascene process). The damascene process is performed by etching the dielectric structure 106 to form a via hole and/or a metal trench, and filling the via hole and/or metal trench with the top electrode via 108t. In some embodiments, the top electrode via 108t, which comprises a conductive material, may be formed using a deposition process and/or a plating process (e.g., electroplating, electro-less plating, etc.). In some embodiments, the top electrode via 108t is a part of the one or more lower interconnect layers 109 and thus, may comprise tungsten, copper, or aluminum copper, or the like.

Figure 14:
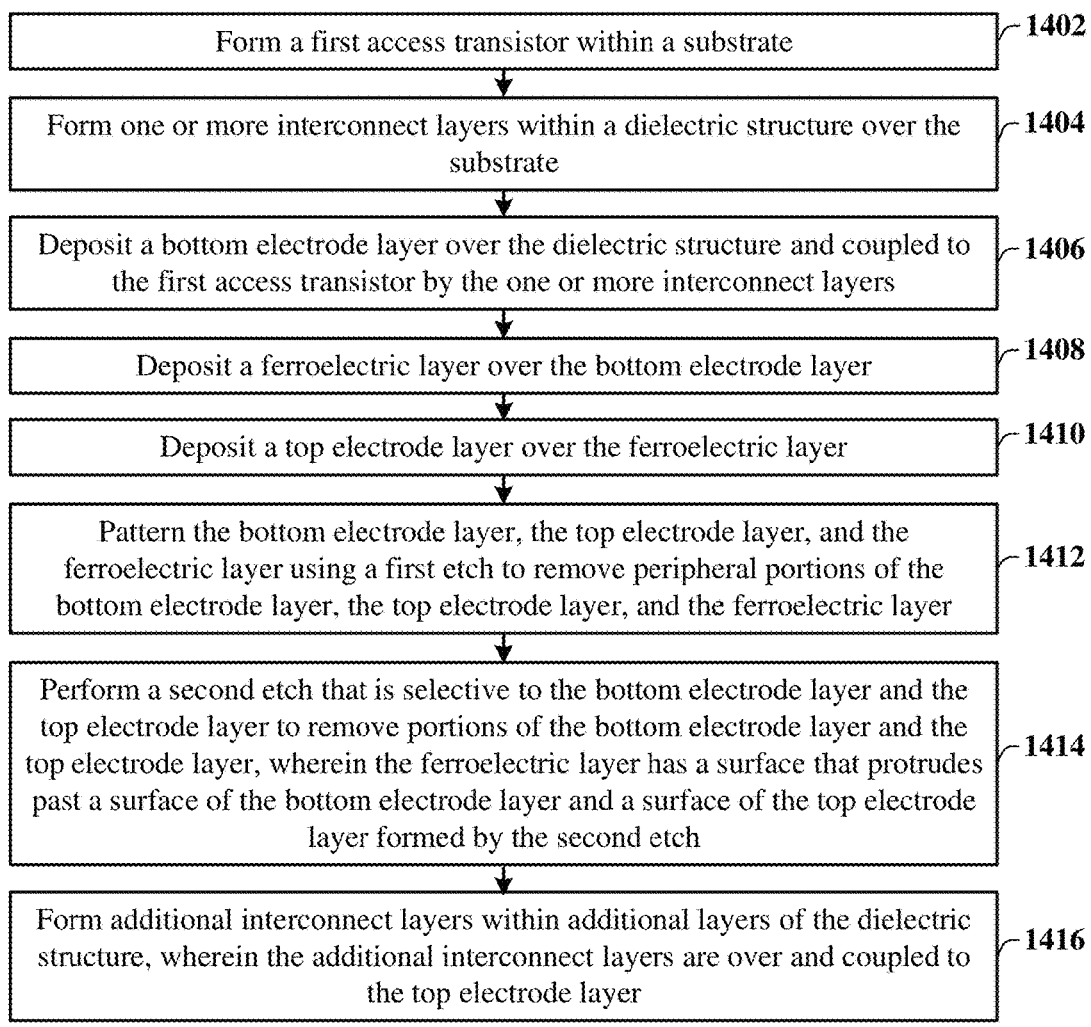
FIG. 14 illustrates a flow diagram of some embodiments of the method of FIGS. 6-13.

FIG. 14 illustrates a flow diagram of some embodiments of a method 1400 of forming an integrated chip having a FeRAM cell as shown in FIGS. 6-13.

While method 1400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, a first access transistor is formed within a substrate.

At 1404, one or more interconnect layers are formed within a dielectric structure that is over the substrate. FIGS. 6 and 7 illustrate the cross-sectional views 600 and 700 of some embodiments that may correspond acts 1402 and 1404.

At 1406, a bottom electrode layer is deposited over the dielectric structure. The bottom electrode layer is coupled to the first access transistor by the one or more interconnect layers.

At 1408, a ferroelectric layer is deposited over the bottom electrode layer.

At 1410, a top electrode layer is deposited over the ferroelectric layer. FIGS. 8A, 9A, 10A, and 11A respectively illustrate the cross-sectional views 800A, 900A, 1000A, and 1100A of various embodiments that may correspond to acts 1406, 1408 and 1410.

At 1412, the bottom electrode layer, the top electrode layer, and the ferroelectric layer are patterned using a first etch to remove peripheral portions of the bottom electrode layer, the top electrode layer and the ferroelectric layer. FIGS. 8C, 9C, 10C, and 11C respectively illustrate cross-sectional views 800C, 900C, 1000C, and 1100C of various embodiments that may correspond to act 1412.

At 1414, a second etch is performed that is selective to the bottom electrode layer and the top electrode layer to remove portions of the bottom electrode layer and the top electrode layer. The ferroelectric layer has a surface that protrudes past a surface of the bottom electrode layer and a surface of the top electrode layer, wherein the surface of the bottom electrode layer and the surface of the top electrode layer were formed by the second etch. FIGS. 8D, 9D, 10D, and 11D respectively illustrate cross-sectional views 800D, 900D, 1000D, and 1100D of various embodiments that may correspond to act 1414.

At 1416, additional interconnect layers are formed within additional layers of the dielectric structure. The additional interconnect layers are over and coupled to the top electrode layer. FIGS. 12 and 13 illustrate cross-sectional views 1200 and 1300 that may correspond to act 1416.

Therefore, the present disclosure relates to a method of manufacturing a FeRAM cell such that a damaged region of a ferroelectric layer is not in direct contact with a top and bottom electrode to prevent the damaged region of the ferroelectric layer from unreliably storing data in the FeRAM cell.

Accordingly, in some embodiments, the present disclosure relates to an integrated chip, comprising: one or more lower interconnect layers arranged within one or more stacked inter-layer dielectric (ILD) layers over a substrate; a bottom electrode disposed over the one or more lower interconnect layers; a top electrode disposed over the bottom electrode; and a ferroelectric layer disposed between and contacting a first surface of the bottom electrode and a second surface of the top electrode, wherein the ferroelectric layer comprises a protrusion extending past outer surfaces of the top electrode and the bottom electrode along a first direction that is perpendicular to a second direction that is normal to the first surface, the protrusion confined between lines extending along the first surface and the second surface.

In other embodiments, the present disclosure relates to an integrated chip, comprising: one or more lower interconnect layers arranged within one or more stacked inter-layer dielectric (ILD) layers over a substrate; a bottom electrode disposed over the one or more lower interconnect layers; a top electrode disposed over the bottom electrode; and a ferroelectric layer disposed between the bottom electrode and the top electrode and extending past outer surfaces of the top electrode and the bottom electrode, wherein a line that is parallel to an interface between the bottom electrode and the ferroelectric layer and that is between the bottom electrode and the top electrode extends through an outermost surface of the ferroelectric layer.

In yet other embodiments, the present disclosure relates to a method of forming an integrated chip, comprising: depositing a ferroelectric layer over a bottom electrode layer; depositing a top electrode layer over the ferroelectric layer; performing a first removal step to remove peripheral portions of the bottom electrode layer, the ferroelectric layer, and the top electrode layer; and performing a second removal step using a second etch that is selective to the bottom electrode layer and the top electrode layer to remove portions of the bottom electrode layer and the top electrode layer, wherein after the second removal step, the ferroelectric layer has a surface that protrudes past a surface of the bottom electrode layer and the top electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   one or more lower interconnect layers arranged within one or more stacked inter-layer dielectric (ILD) layers over a substrate;
   a first bottom electrode layer disposed over the one or more lower interconnect layers;
   a second bottom electrode layer disposed over the first bottom electrode layer;
   a first top electrode layer disposed over the second bottom electrode layer; and
   a ferroelectric layer disposed between the second bottom electrode layer and the first top electrode layer,
   wherein the ferroelectric layer is wider than the second bottom electrode layer and is wider than the first top electrode layer, and wherein the first bottom electrode layer is wider than the ferroelectric layer, and
   wherein the ferroelectric layer has outer sidewalls with a first surface roughness, and the first bottom electrode layer has outer sidewalls with a second surface roughness, and the first surface roughness is greater than the second surface roughness.

2. The integrated chip of claim 1, wherein the ferroelectric layer contacts a first surface of the second bottom electrode layer and a second surface of the first top electrode layer.

3. The integrated chip of claim 1, wherein widths of the ferroelectric layer, the second bottom electrode layer, and the first bottom electrode layer are measured in a first direction parallel to a bottommost surface of the first bottom electrode layer.

4. The integrated chip of claim 1, wherein the ferroelectric layer comprises a protrusion extending past outer surfaces of the first top electrode layer and the second bottom electrode layer, wherein the protrusion is confined between lines extending along a first surface of the second bottom electrode layer and a second surface of the first top electrode layer.

5. The integrated chip of claim 4, wherein the protrusion has a thickness measured in a second direction normal to the first surface that is less than a distance between the first surface of the second bottom electrode layer and the second surface of the first top electrode layer measured in the second direction.

6. The integrated chip of claim 1, further comprising a second top electrode layer overlying the first top electrode layer, wherein the second top electrode layer is wider than the ferroelectric layer.

7. The integrated chip of claim 1, wherein the ferroelectric layer has upper and lower surfaces with a third surface roughness, and the first surface roughness is greater than the third surface roughness.

8. An integrated chip, comprising:
   one or more lower interconnect layers arranged within one or more stacked inter-layer dielectric (ILD) layers over a substrate;
   a bottom electrode disposed over the one or more lower interconnect layers;
   a top electrode disposed over the bottom electrode;
   a ferroelectric layer disposed between and contacting a first surface of the bottom electrode and a second surface of the top electrode, wherein the ferroelectric layer comprises a protrusion; and
   a first ILD surrounding the protrusion and comprising a first portion both directly beneath the protrusion and above the first surface and a second portion both directly above the protrusion and beneath the second surface,
    wherein the protrusion has a thickness measured in a first direction normal to the first surface, where the thickness is less than a distance between the first surface of the bottom electrode and the second surface of the top electrode measured in the first direction,
    wherein the protrusion has a topmost surface that is between the first surface of the bottom electrode and the second surface of the top electrode.

9. The integrated chip of claim 8, wherein the protrusion extends past outer surfaces of the top electrode and the bottom electrode along a second direction that is perpendicular to the first direction, the protrusion confined between lines extending along the first surface and the second surface.

10. The integrated chip of claim 8, wherein the protrusion has a third surface that connects a fourth surface and a fifth surface of the protrusion, wherein the first surface has a greater surface roughness than the second and third surfaces of the protrusion.

11. The integrated chip of claim 10, wherein the bottom electrode has a first outer surface substantially parallel to the third surface of the protrusion, and wherein the third surface of the protrusion has a greater surface roughness than the first outer surface of the bottom electrode.

12. The integrated chip of claim 8, further comprising:
    an additional layer of the top electrode disposed over the top electrode; and
    second ILD layer extending directly between the additional layer and the ferroelectric layer.

13. The integrated chip of claim 12, wherein the additional layer of the top electrode has a width about equal to a width of the ferroelectric layer.

14. The integrated chip of claim 8, wherein the protrusion further comprises an outer surface extending in the first direction and contacting the topmost surface of the protrusion, wherein the outer surface has a height less than a distance between the first surface of the bottom electrode and the topmost surface of the protrusion measured in the first direction.

15. The integrated chip of claim 8, wherein the bottom electrode has a first width and the top electrode has a second width substantially equal to the first width.

16. An integrated chip, comprising:
    one or more lower interconnect layers arranged within one or more stacked inter-layer dielectric (ILD) layers over a substrate;
    a bottom electrode disposed over the one or more lower interconnect layers;
    a top electrode disposed over the bottom electrode; and
    a ferroelectric layer disposed between the bottom electrode and the top electrode and having a first lower surface a first height above a bottom surface of the bottom electrode, a second lower surface a second height above the bottom surface of the bottom electrode, and a first upper surface a third height above the bottom surface of the bottom electrode and below a top surface of the ferroelectric layer, wherein the second height is greater than the first height, and the third height is greater than the second height, and wherein the ferroelectric layer comprises a protrusion extending past outer sidewalls of the bottom electrode and the top electrode, and wherein the first upper surface and the second lower surface surround the protrusion.

17. The integrated chip of claim 16, wherein the first upper surface is directly above the second lower surface.

18. The integrated chip of claim 16, wherein the protrusion continuously surrounds a center portion of the ferroelectric layer, wherein the first lower surface and the top surface are outer surfaces of the center portion.

19. The integrated chip of claim 16, wherein the first lower surface directly contacts the bottom electrode and the top surface of the ferroelectric layer directly contacts the top electrode.

20. The integrated chip of claim 16, further comprising:
    a first outer surface of the ferroelectric layer connecting the first upper surface and the second lower surface, the first outer surface having a first surface roughness; and
    a second outer surface of the top electrode, the second outer surface having a second surface roughness that is less than the first surface roughness.

* * * * *